US 9,111,729 B2

(12) United States Patent
Gottscho et al.

(10) Patent No.: US 9,111,729 B2
(45) Date of Patent: Aug. 18, 2015

(54) SMALL PLASMA CHAMBER SYSTEMS AND METHODS

(75) Inventors: Richard Gottscho, Fremont, CA (US);
Rajinder Dhindsa, Fremont, CA (US);
Mukund Srinivasan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 199 days.

(21) Appl. No.: 12/957,923

(22) Filed: Dec. 1, 2010

(65) Prior Publication Data

US 2011/0132874 A1    Jun. 9, 2011

Related U.S. Application Data

(60) Provisional application No. 61/266,476, filed on Dec. 3, 2009.

(51) Int. Cl.
| | |
|---|---|
| *C23C 16/00* | (2006.01) |
| *C23F 1/00* | (2006.01) |
| *H01L 21/306* | (2006.01) |
| *H01J 7/24* | (2006.01) |
| *H01J 37/32* | (2006.01) |

(Continued)

(52) U.S. Cl.
CPC ..... *H01J 37/32366* (2013.01); *H01J 37/32082* (2013.01); *H01J 37/32137* (2013.01); *H01J 37/32376* (2013.01); *H01L 21/6719* (2013.01); *H01L 21/68764* (2013.01); *H01L 21/68771* (2013.01); *H01L 21/68785* (2013.01)

(58) Field of Classification Search
CPC .............. H01J 37/32366; H01J 37/32376
USPC ............. 156/345.43–345.47; 118/715, 722, 118/723 R, 723 E; 315/111.21
See application file for complete search history.

(56) References Cited

U.S. PATENT DOCUMENTS

| | | | |
|---|---|---|---|
| 4,209,357 A | * | 6/1980 | Gorin et al. .................. 438/710 |
| 4,276,557 A | | 6/1981 | Levinstein et al. |

(Continued)

FOREIGN PATENT DOCUMENTS

| | | |
|---|---|---|
| EP | 1155164 B1 | 7/2010 |
| JP | 61-189642 A | 8/1986 |

(Continued)

OTHER PUBLICATIONS

Yamamoto, T. Ono, M. Takahashi, M. Ando, M. Goto, N.G. Yasaka, Y. Ishii, N.; Dept. of Electr. & Electron. Eng., Yamagata Univ. Yonezawa, Japan—Antennas and Propagation Society International Symposium, 2001. IEEE; Pub. Date: Jul. 8-13, 2001—vol. 3; pp. 712-715 vol. 3.

(Continued)

*Primary Examiner* — Maureen Gramaglia
(74) *Attorney, Agent, or Firm* — Martine Penilla Group, LLP

(57) ABSTRACT

A plasma etch processing tool is disclosed. The plasma etch processing tool, comprising a substrate support for supporting a substrate having a substrate surface area, a processing head including a plasma microchamber having an open side that is oriented over the substrate support, the open side of the plasma microchamber having a process area that is less than the substrate surface area, a sealing structure defined between the substrate support and the processing head and a power supply connected to the plasma microchamber and the substrate support. A method for performing a plasma etch is also disclosed.

44 Claims, 37 Drawing Sheets

(51) Int. Cl.
*H01L 21/67* (2006.01)
*H01L 21/687* (2006.01)

(56) References Cited

U.S. PATENT DOCUMENTS

| | | | |
|---|---|---|---|
| 4,340,462 A | 7/1982 | Koch | |
| 5,108,778 A | 4/1992 | Suzuki et al. | |
| 5,183,990 A | 2/1993 | Enyedy | |
| 5,302,237 A * | 4/1994 | Larson et al. | 216/37 |
| 5,349,271 A | 9/1994 | Van Os et al. | |
| 5,505,780 A | 4/1996 | Dalvie et al. | |
| 5,620,524 A | 4/1997 | Fan et al. | |
| 5,630,880 A | 5/1997 | Eastlund | |
| 5,651,867 A * | 7/1997 | Kokaku et al. | 204/298.25 |
| 5,904,780 A | 5/1999 | Tomoyasu | |
| 5,998,933 A | 12/1999 | Shun'ko | |
| 6,150,628 A | 11/2000 | Smith et al. | |
| 6,190,236 B1 | 2/2001 | Drill | |
| 6,335,293 B1 | 1/2002 | Luo et al. | |
| 6,337,460 B2 | 1/2002 | Kelkar et al. | |
| 6,388,226 B1 | 5/2002 | Smith et al. | |
| 6,392,351 B1 | 5/2002 | Shun'ko | |
| 6,432,260 B1 | 8/2002 | Mahoney et al. | |
| 6,444,137 B1 | 9/2002 | Collins et al. | |
| 6,527,911 B1 | 3/2003 | Yen et al. | |
| 6,641,698 B2 | 11/2003 | Kabansky | |
| 6,755,150 B2 | 6/2004 | Lai et al. | |
| 6,761,804 B2 | 7/2004 | Perrin | |
| 6,825,618 B2 | 11/2004 | Pu et al. | |
| 6,830,652 B1 | 12/2004 | Ohmi et al. | |
| 6,836,073 B2 | 12/2004 | Matsushita | |
| 6,851,384 B2 | 2/2005 | Yuda et al. | |
| 6,855,906 B2 | 2/2005 | Brailove | |
| 6,872,259 B2 | 3/2005 | Strang | |
| 6,924,455 B1 | 8/2005 | Chen et al. | |
| 6,936,546 B2 * | 8/2005 | Robbins | 438/707 |
| 6,962,644 B2 | 11/2005 | Paterson et al. | |
| 6,988,327 B2 | 1/2006 | Garcia et al. | |
| 7,069,937 B2 | 7/2006 | Garcia et al. | |
| 7,198,055 B2 | 4/2007 | Woods et al. | |
| 7,217,337 B2 | 5/2007 | Choi | |
| 7,234,477 B2 | 6/2007 | De Larios et al. | |
| 7,363,876 B2 | 4/2008 | Lai et al. | |
| 7,411,352 B2 | 8/2008 | Madocks | |
| 7,513,262 B2 | 4/2009 | Woods | |
| 7,645,495 B2 * | 1/2010 | Dings et al. | 427/569 |
| 7,785,672 B2 | 8/2010 | Choi et al. | |
| 7,895,970 B2 | 3/2011 | Honda et al. | |
| 8,056,503 B2 | 11/2011 | Kikuchi et al. | |
| 8,169,148 B2 | 5/2012 | Jeon et al. | |
| 2001/0000104 A1 | 4/2001 | Li et al. | |
| 2001/0002582 A1 | 6/2001 | Dunham et al. | |
| 2001/0003271 A1 | 6/2001 | Otsuki | |
| 2001/0023741 A1 | 9/2001 | Collison et al. | |
| 2001/0047760 A1 | 12/2001 | Moslehi | |
| 2001/0051439 A1 | 12/2001 | Khan et al. | |
| 2002/0030167 A1 | 3/2002 | Liebert et al. | |
| 2002/0101167 A1 | 8/2002 | Shan et al. | |
| 2002/0104821 A1 | 8/2002 | Bazylenko et al. | |
| 2002/0121345 A1 | 9/2002 | Chen et al. | |
| 2003/0015965 A1 | 1/2003 | Godyak | |
| 2003/0071035 A1 | 4/2003 | Brailove | |
| 2003/0106647 A1 * | 6/2003 | Koshiishi et al. | 156/345.53 |
| 2003/0188685 A1 | 10/2003 | Wang et al. | |
| 2003/0213560 A1 | 11/2003 | Wang et al. | |
| 2004/0018320 A1 | 1/2004 | Nicolussi | |
| 2004/0027781 A1 | 2/2004 | Hanawa et al. | |
| 2004/0047720 A1 | 3/2004 | Lerner | |
| 2004/0175953 A1 | 9/2004 | Ogle | |
| 2004/0231799 A1 | 11/2004 | Lee et al. | |
| 2004/0238123 A1 | 12/2004 | Becknell et al. | |
| 2004/0238124 A1 * | 12/2004 | Nakamura | 156/345.43 |
| 2005/0000655 A1 | 1/2005 | Wi | |
| 2005/0001556 A1 | 1/2005 | Hoffman et al. | |
| 2005/0103620 A1 | 5/2005 | Chistyakov | |
| 2005/0160985 A1 | 7/2005 | Brcka | |
| 2005/0184670 A1 | 8/2005 | Lacoste et al. | |
| 2005/0194100 A1 | 9/2005 | Or et al. | |
| 2005/0279458 A1 * | 12/2005 | Okumura et al. | 156/345.47 |
| 2006/0065623 A1 | 3/2006 | Guiney et al. | |
| 2006/0236931 A1 | 10/2006 | Singh et al. | |
| 2006/0289409 A1 | 12/2006 | Choi et al. | |
| 2007/0032081 A1 | 2/2007 | Chang et al. | |
| 2007/0081295 A1 | 4/2007 | Brillhart et al. | |
| 2007/0163440 A1 | 7/2007 | Kim et al. | |
| 2007/0212484 A1 | 9/2007 | Li | |
| 2007/0251642 A1 | 11/2007 | Bera et al. | |
| 2007/0277930 A1 | 12/2007 | Yokoyama et al. | |
| 2007/0289710 A1 | 12/2007 | Hudson et al. | |
| 2008/0020574 A1 | 1/2008 | Marakhtanov et al. | |
| 2008/0041820 A1 | 2/2008 | Tong et al. | |
| 2008/0099145 A1 | 5/2008 | Keller | |
| 2008/0110860 A1 | 5/2008 | Miller et al. | |
| 2008/0173237 A1 | 7/2008 | Collins et al. | |
| 2008/0179007 A1 | 7/2008 | Collins et al. | |
| 2008/0179546 A1 | 7/2008 | Lee et al. | |
| 2008/0286489 A1 * | 11/2008 | Wang et al. | 427/569 |
| 2008/0286697 A1 | 11/2008 | Verhaverbeke et al. | |
| 2008/0302652 A1 | 12/2008 | Entley et al. | |
| 2009/0015165 A1 | 1/2009 | Jeon et al. | |
| 2009/0025879 A1 | 1/2009 | Rauf et al. | |
| 2009/0061087 A1 | 3/2009 | Endo et al. | |
| 2009/0061542 A1 | 3/2009 | Patrick | |
| 2009/0066315 A1 | 3/2009 | Hu et al. | |
| 2009/0068849 A1 | 3/2009 | Endo et al. | |
| 2009/0109595 A1 | 4/2009 | Herchen et al. | |
| 2009/0200268 A1 | 8/2009 | Tappan et al. | |
| 2009/0200269 A1 | 8/2009 | Kadkhodayan et al. | |
| 2009/0218212 A1 | 9/2009 | Denpoh et al. | |
| 2009/0233384 A1 | 9/2009 | Foad et al. | |
| 2009/0242135 A1 | 10/2009 | Koshimizu et al. | |
| 2009/0250340 A1 | 10/2009 | Sasaki et al. | |
| 2009/0250443 A1 | 10/2009 | Kim | |
| 2009/0272492 A1 | 11/2009 | Katz et al. | |
| 2009/0275210 A1 | 11/2009 | Shanker et al. | |
| 2009/0277585 A1 | 11/2009 | Maebashi et al. | |
| 2009/0286333 A1 | 11/2009 | Kozasa et al. | |
| 2009/0286405 A1 | 11/2009 | Okesaku et al. | |
| 2009/0305509 A1 | 12/2009 | Stevenson et al. | |
| 2009/0321019 A1 | 12/2009 | Chen et al. | |
| 2009/0321249 A1 | 12/2009 | Chistyakov | |
| 2010/0008016 A1 | 1/2010 | Onate et al. | |
| 2010/0024729 A1 | 2/2010 | Cao et al. | |
| 2010/0065215 A1 | 3/2010 | Jeon et al. | |
| 2010/0072172 A1 | 3/2010 | Ui et al. | |
| 2010/0116788 A1 | 5/2010 | Singh et al. | |
| 2010/0116790 A1 | 5/2010 | Spitzl | |
| 2010/0140223 A1 | 6/2010 | Tyler et al. | |
| 2010/0147050 A1 | 6/2010 | Barth | |
| 2010/0319852 A1 | 12/2010 | Brillhart et al. | |
| 2011/0061687 A1 | 3/2011 | Mikhaylichenko et al. | |
| 2011/0075313 A1 | 3/2011 | Comendant | |
| 2011/0108524 A1 | 5/2011 | Dhindsa et al. | |
| 2011/0209663 A1 | 9/2011 | Endo et al. | |
| 2012/0142197 A1 | 6/2012 | Endo et al. | |
| 2013/0093443 A1 | 4/2013 | Patrick | |

FOREIGN PATENT DOCUMENTS

| | | |
|---|---|---|
| JP | 5166595 | 7/1993 |
| JP | 5144594 | 11/1993 |
| JP | 71-83282 A | 7/1995 |
| JP | 2004-296729 A | 10/2004 |
| KR | 663668 B | 1/2007 |
| KR | 2007079870 A | 8/2007 |
| RU | 2022917 | 11/1994 |
| RU | 2056702 | 3/1996 |
| RU | 2094961 | 10/1997 |
| WO | WO0136703 A1 | 5/2001 |

OTHER PUBLICATIONS

Koretzky, E. Kuo, S.P.;Polytech. Univ., Farmingdale, NY, USA; Plasma Science, 1997 IEEE—Pub.Date: May 19-22, 1997; on p. 284.

(56) References Cited

OTHER PUBLICATIONS

International Search Report dated Feb. 1, 2011 (2 pages).
NPL Bias.
PCT International Search Report—PCT/US2011/001174 dated Dec. 6, 2011.
PCT International Search Report—PCT/US2011/001175 dated Nov. 29, 2011.
PCT International Search Report—PCT/US2011/01176 dated Jan. 19, 2012.
PCT International Search Report—PCT/US2012/063987—dated Jan. 28, 2013.
PCT International Search Report—PCT/US2012/065080—dated Jan. 28, 2013.
PCT International Search Report—PCT/US2012/065122—dated Mar. 25, 2013.
PCT International Search Report—PCT/US2012/065333—dated Jan. 25, 2013.
PCT International Search Report—PCT/US2012/065677—dated Feb. 7, 2013.
PCT International Search Report—PCT/US2012/065684—dated Jan. 28, 2013.
PCT International Search Report—PCT/US2012/065949—dated Feb. 5, 2013.
PCT International Search Report—PCT/US2012/066467—dated Feb. 8, 2013.

* cited by examiner

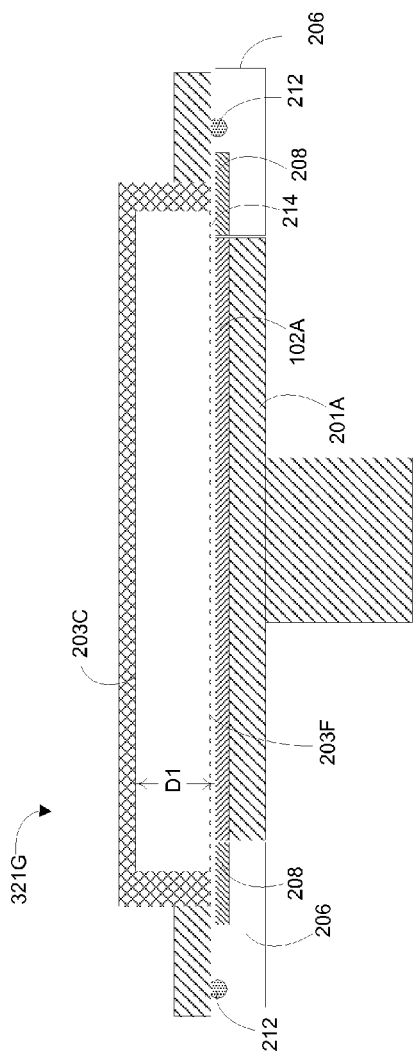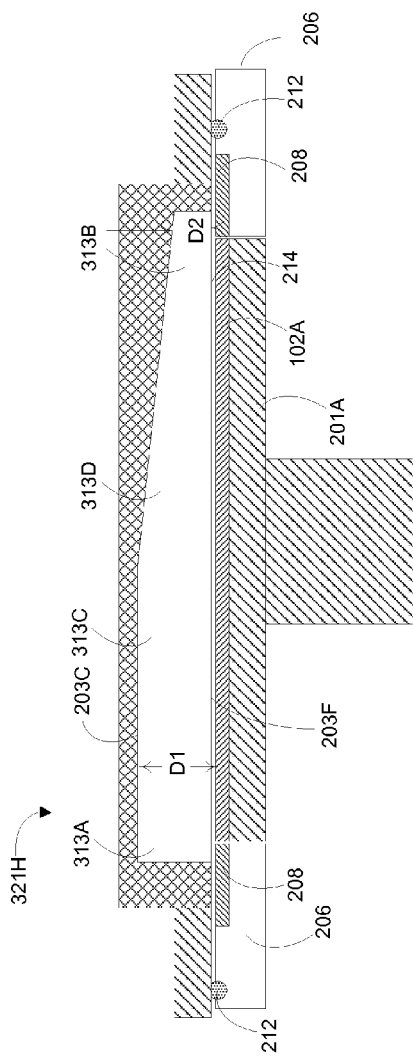

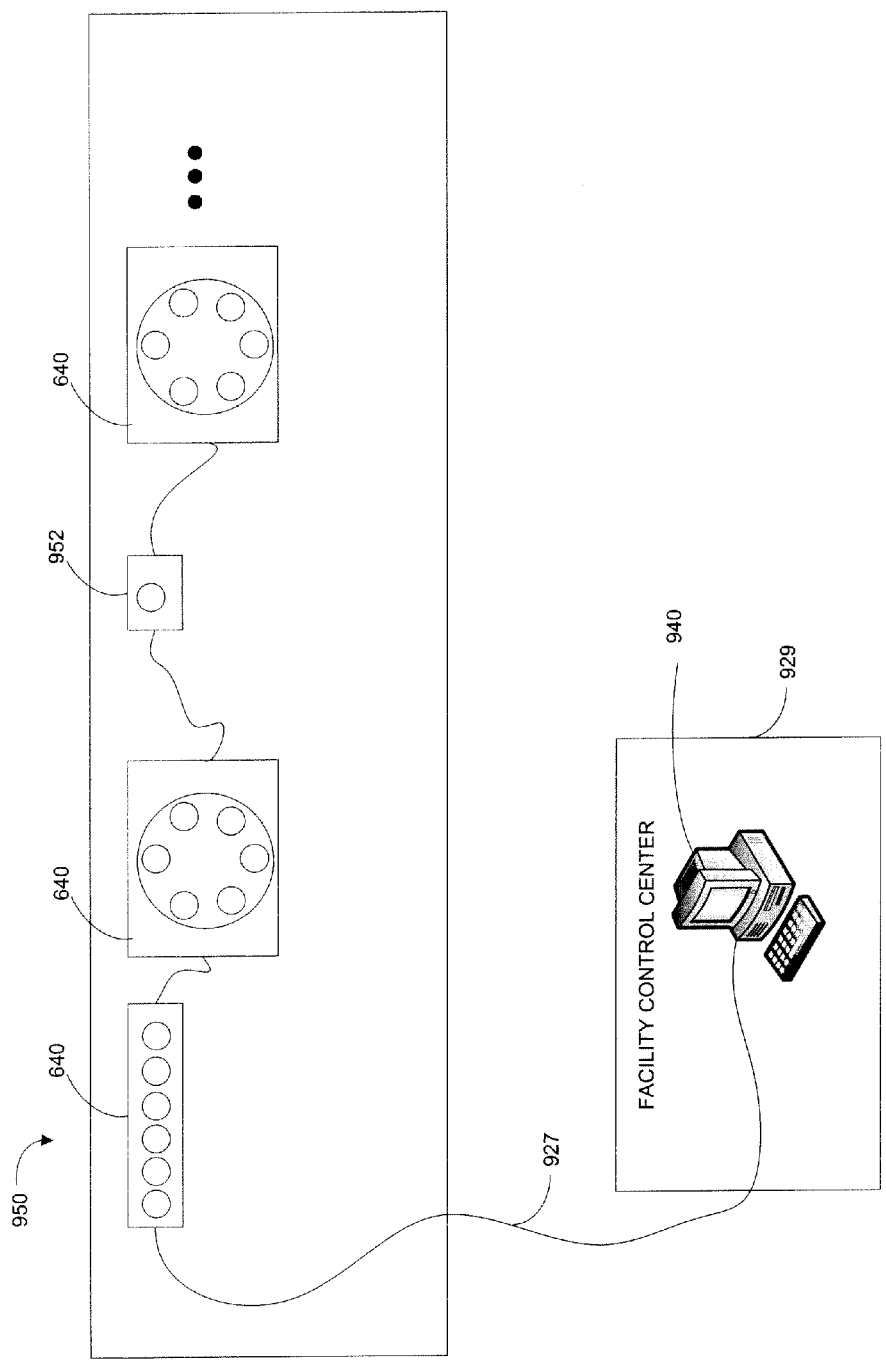

SMALL PLASMA CHAMBER SYSTEMS AND METHODS

PRIORITY CLAIM

This application claims priority from U.S. Provisional Patent Application No. 61/266,476 filed on Dec. 3, 2009 and entitled "Small Plasma Chamber Systems and Methods," which is incorporated herein by reference in its entirety for all purposes.

BACKGROUND

The present invention relates generally to plasma processing of substrates, and more particularly, to methods and systems for plasma processing of a portion of a substrate surface using a small plasma processing chamber.

FIG. 1 is a typical plasma processing chamber 100. The typical plasma processing chamber 100 encloses the entire substrate 102 to be processed. The substrate 102 is loaded into the processing chamber 100. The processing chamber 100 is then sealed and purged to evacuate undesired gases though the outlet 112. A pump 114 may assist in drawing out the undesired gases. Purge gases or processing gases may be pumped into the processing chamber 100 from a processing and/or purging gas source 120 coupled to an input port 122. The purge gases or processing gases may be pumped out the processing chamber 100 to dilute or otherwise remove the undesired gases.

An electrical connection is made to the substrate 102, typically through an electrostatic chuck 104. A plasma signal source 108B is coupled to the substrate 102, typically through the electrostatic chuck 104. A plasma signal source 108A is coupled to an emitter 106 in the processing chamber.

The desired gas(es) at the desired pressures and flowrates are then input to the processing chamber 100. The plasma 110 is initiated by outputting a processing signal (e.g., RF) at the desired frequency and potential from the signal source 108 and imparting the emitted energy to the gases in the processing chamber 100. Ions 110A generated by the plasma directly impinge on the entire surface of the substrate 102. The plasma 110 also generates heat which is absorbed at least in part by the substrate 102. The electrostatic chuck 104 can also cool the substrate 102.

The typical plasma processing chamber 100 is larger than the substrate 100 to be processed so that the entire substrate can be processed within the processing chamber at one time. As the typical plasma processing chamber 100 is increased in size the amount of purging gas and the time required to purge the processing chamber 100 increases. As a result, a larger processing chamber 100 has an increased purging time before and after the substrate 102 is processed.

The throughput of the typical processing chamber 100 is substantially determined by a sum of the substrate loading time, the preprocessing purging time, the substrate processing time, the post-processing purging time and the unloading time. Therefore, the increased purging time of the larger processing chamber 100 decreases the throughput as the size of the substrate 102 increases.

The entire surface of the substrate 102 is processed (e.g., exposed to the plasma 110) at the same time in the typical processing chamber 100. The plasma 110 must be sufficiently large enough to substantially evenly expose the entire surface of the substrate 102 at one time. As the size of the substrate 102 increases the amount of energy required to generate the plasma 110 increases approximately with the square of the area of the surface of the substrate. As a result, the energy requirements for larger substrates 102 increases and the throughput decreases.

In view of the foregoing, there is a need for improved plasma processing systems and methods that is scalable to ever larger substrates without sacrificing throughput.

SUMMARY

Broadly speaking, the present invention fills these needs by providing improved plasma processing systems and methods that are scalable to ever larger substrates without sacrificing throughput. It should be appreciated that the present invention can be implemented in numerous ways, including as a process, an apparatus, a system, computer readable media, or a device. Other aspects and advantages of the invention will become apparent from the following detailed description, taken in conjunction with the accompanying drawings, illustrating by way of example the principles of the invention.

One embodiment provides a plasma etch processing tool, including a substrate support for supporting a substrate having a substrate surface area, a processing head including a plasma microchamber having an open side that is oriented over the substrate support, the open side of the plasma microchamber having a process area that is less than the substrate surface area, a sealing structure defined between the substrate support and the processing head and a power supply connected to the plasma microchamber and the substrate support.

The power supply can have a setting that is proportional to a volume in the plasma microchamber. The power supply can include a first power supply coupled to the plasma microchamber and a second power supply coupled to the substrate support.

The substrate support can be a chuck. The chuck can have a chucking area that is less than or equal an area of the substrate.

The plasma microchamber is movable relative to the substrate. Only a portion of the substrate support may be biased and wherein the biased portion of the substrate support is substantially aligned with the plasma microchamber. The biased portion of the substrate support can be movable for maintaining substantial alignment with the movable plasma microchamber.

The plasma microchamber can have a microchamber volume and wherein the microchamber volume contains a plasma.

The plasma etch processing tool can also include a process material source coupled to the plasma microchamber and a vacuum source coupled to the plasma microchamber. The vacuum source can have an adjustable vacuum source.

The plasma etch processing tool can also include a sealing structure. The sealing structure can include a sealing ring. The sealing structure can include an outer chamber around the microchamber.

The plasma microchamber can be movable relative to the substrate and an actuator connected to the substrate support can also be included. The actuator can be configured to move the substrate support so as to expose a selected region of substrate surface, when placed over the substrate support. The actuator can be configured to move in one or more of a rotational direction, an angular direction, a linear direction, a non-linear direction, or a pivoting direction.

The plasma microchamber can be movable relative to the substrate and an actuator can be connected to the plasma microchamber, the actuator can be configured to move the plasma microchamber so as to expose a selected region of substrate surface, when placed over the substrate support. The actuator can be configured to move in one or more of a rotational direction, an angular direction, a linear direction, a non-linear direction, or a pivoting direction.

The substrate support can be configured to rotate the substrate. The substrate support can include an edge ring. At least a portion of the edge ring can be biased. At least a portion of the edge ring can be replaceable. At least a portion of the edge ring can be reactive with a plasma in the plasma microchamber. The edge ring can be adjacent to at least a portion of an edge of a substrate when present on the substrate support. The edge ring can be adjacent to a curved portion of an edge of a substrate when present on the substrate support.

The microchamber can include multiple inlet ports and multiple outlet ports. At least one of the inlet ports is coupled to one of a multiple process material sources. At least one of the inlet ports can be coupled to a purge material source. At least one of the outlet ports can be coupled to a vacuum source.

The plasma etch processing tool can also include at least one monitoring instrument. The monitoring instrument can monitor a byproduct output from the plasma microchamber. The monitoring instrument can monitor a spectrum of light emitted from the plasma microchamber. The monitoring instrument can be coupled to a controller. The monitoring instrument can monitor the surface of the substrate.

An inner volume of the plasma microchamber can have a constant width along a length of the plasma microchamber. An inner volume of the plasma microchamber can have a width that varies along a length of the plasma microchamber. An inner volume of the plasma microchamber can have a constant depth that along a length of the plasma microchamber. An inner volume of the plasma microchamber can have a depth that varies along a length of the plasma microchamber. An inner volume of the plasma microchamber can have a depth that is adjustable along a length of the plasma microchamber.

The plasma etch processing tool can include multiple plasma microchambers. The multiple plasma microchambers can have a linear arrangement. The multiple plasma microchambers can have a rotary arrangement.

Another embodiment provides a method of performing a plasma etch including forming a plasma in a plasma microchamber. The microchamber including a substrate support for supporting a substrate having a substrate surface area, a processing head including a plasma microchamber having an open side that is oriented over the substrate support, the open side of the plasma microchamber having a process area that is less than the substrate surface area, a sealing structure defined between the substrate support and the processing head and a power supply connected to the plasma microchamber and the substrate support. The plasma microchamber is moved relative to a surface of the substrate, when present in the substrate support, until a selected one of multiple surfaces of the substrate is exposed to the plasma.

The method can also include drawing multiple plasma byproducts out of the plasma microchamber. The plasma byproducts are drawn out of the plasma microchamber near a top portion of the plasma microchamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIGS. 3N-3P are lengthwise cross-sectional views of microchambers, respectively, in accordance with embodiments of the present invention.

FIG. 9B shows multiple processing head process tools in a manufacturing facility, in accordance with embodiments of the present invention.

DETAILED DESCRIPTION

Several exemplary embodiments for improved plasma processing systems and methods that are scalable to ever larger substrates without sacrificing throughput will now be described. It will be apparent to those skilled in the art that the present invention may be practiced without some or all of the specific details set forth herein.

I. Less Than Full Surface Etch Processing

Present semiconductor processing is mostly focused on 200 mm and 300 mm semiconductor wafers and flat panel substrates of different shapes and sizes. As the need for throughput grows, future semiconductor wafers and substrates will be larger, such as the next generation of semiconductor wafers that are 450 mm and larger. In the typical plasma processing, the plasma chamber volume grows much faster than the diameter of the wafer intended to be process within the plasma chamber. As the volume of the plasma chamber increases the material costs of building the plasma chamber also increase. Also as the volume of the plasma chamber increases, the plasma becomes more difficult to control and maintain consistency throughout the chamber. Further, as the volume increases the energy requirements to generate the plasma also increases thus driving the energy costs higher yet yielding less consistent results. Reducing the volume of the plasma chamber reduces the materials required to produce the plasma chamber and also increases consistency and reduces the energy requirements. A small plasma chamber, e.g., a microchamber, is more easily scalable to larger and smaller area surfaces to be exposed to the plasma. It should be understood that the semiconductor substrate to be processed or exposed to the plasma can be any surface such as a semiconductor substrate, a flat panel substrate of any shape or size.

Figure 1:
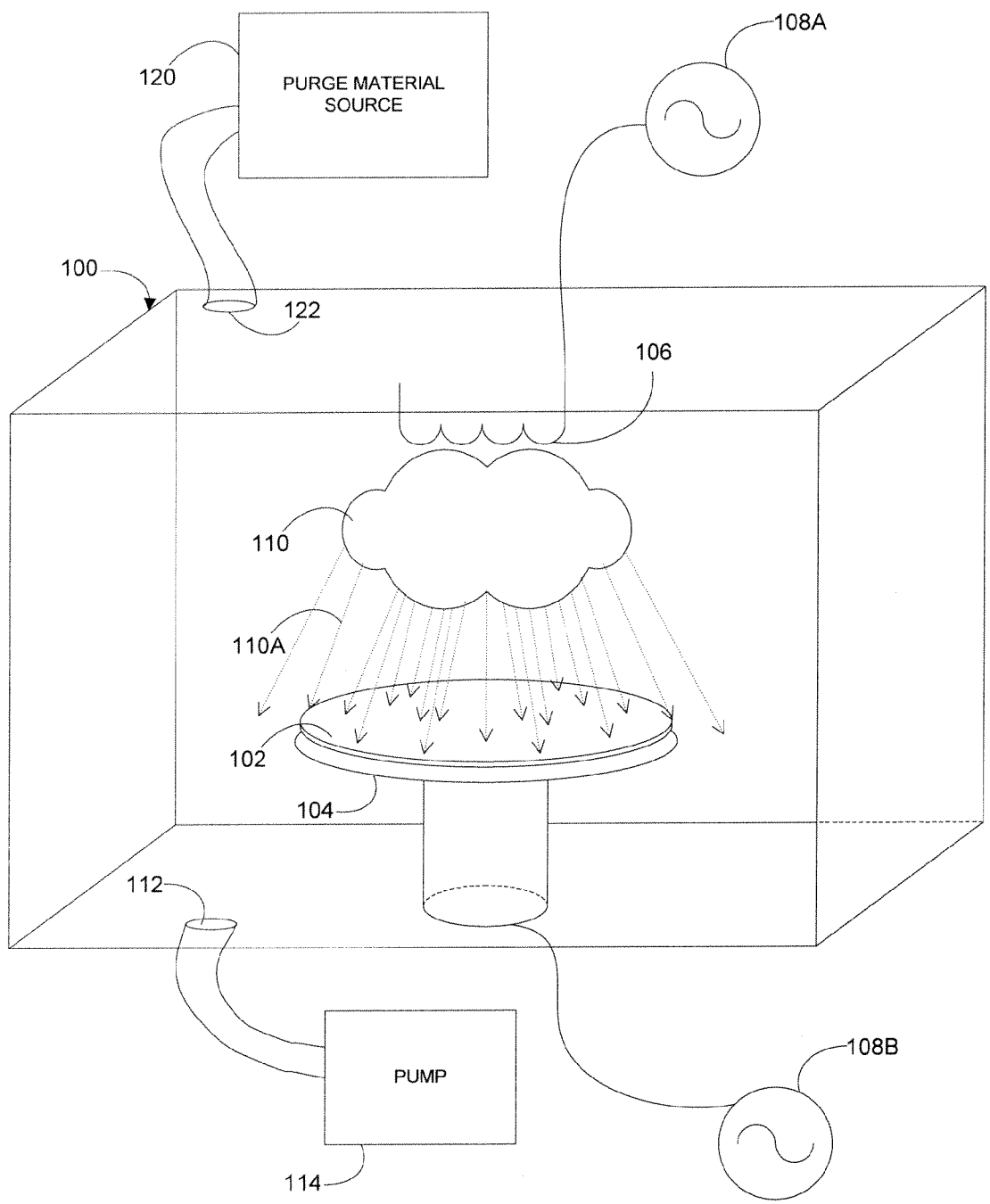
FIG. 1 is a typical plasma processing chamber.
Figure 2A:
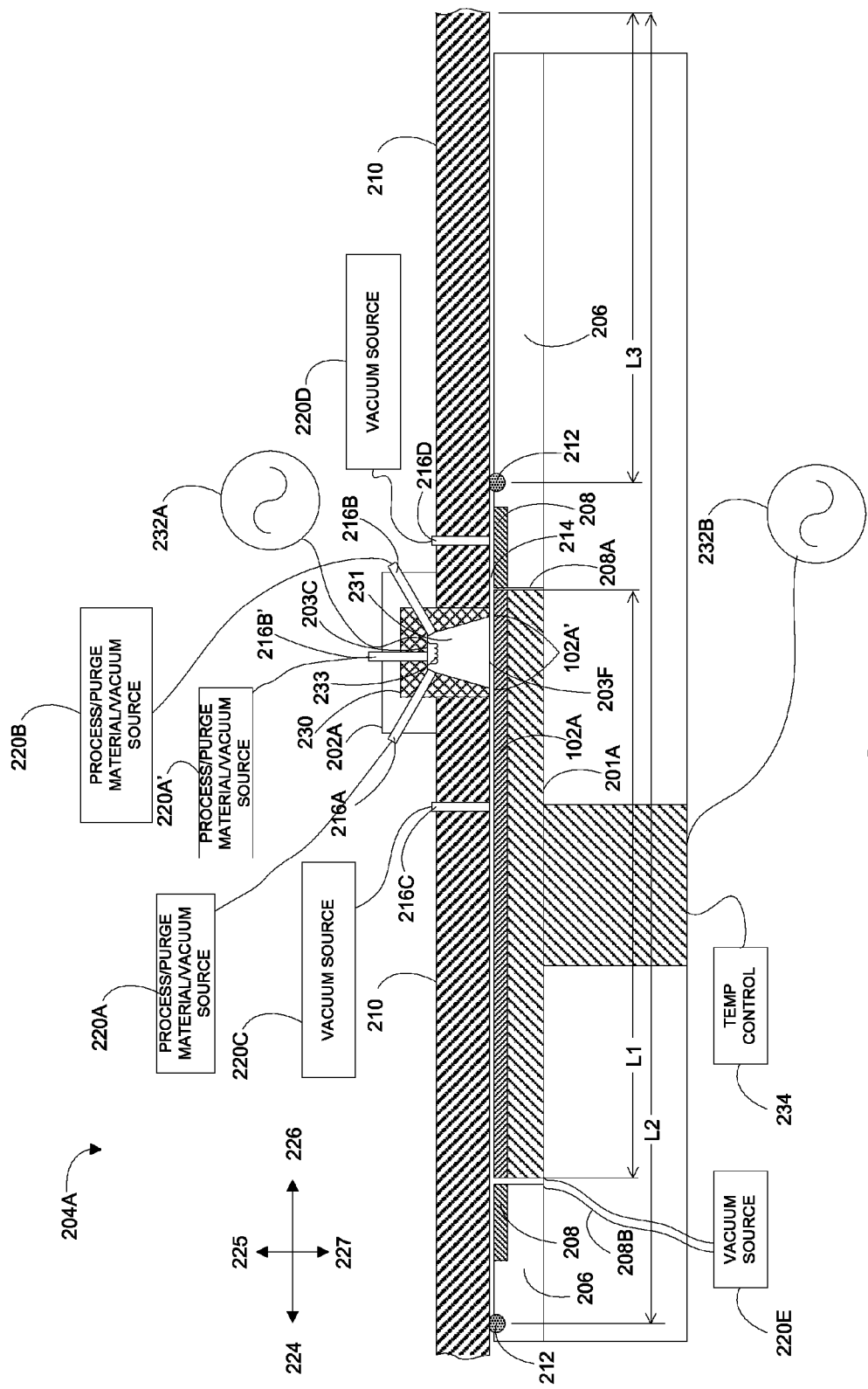
FIGS. 2A-2C show embodiments of a plasma processing system that process selected portions of a full surface of the surface being processed in accordance with embodiments of the present invention.
Figure 2B:
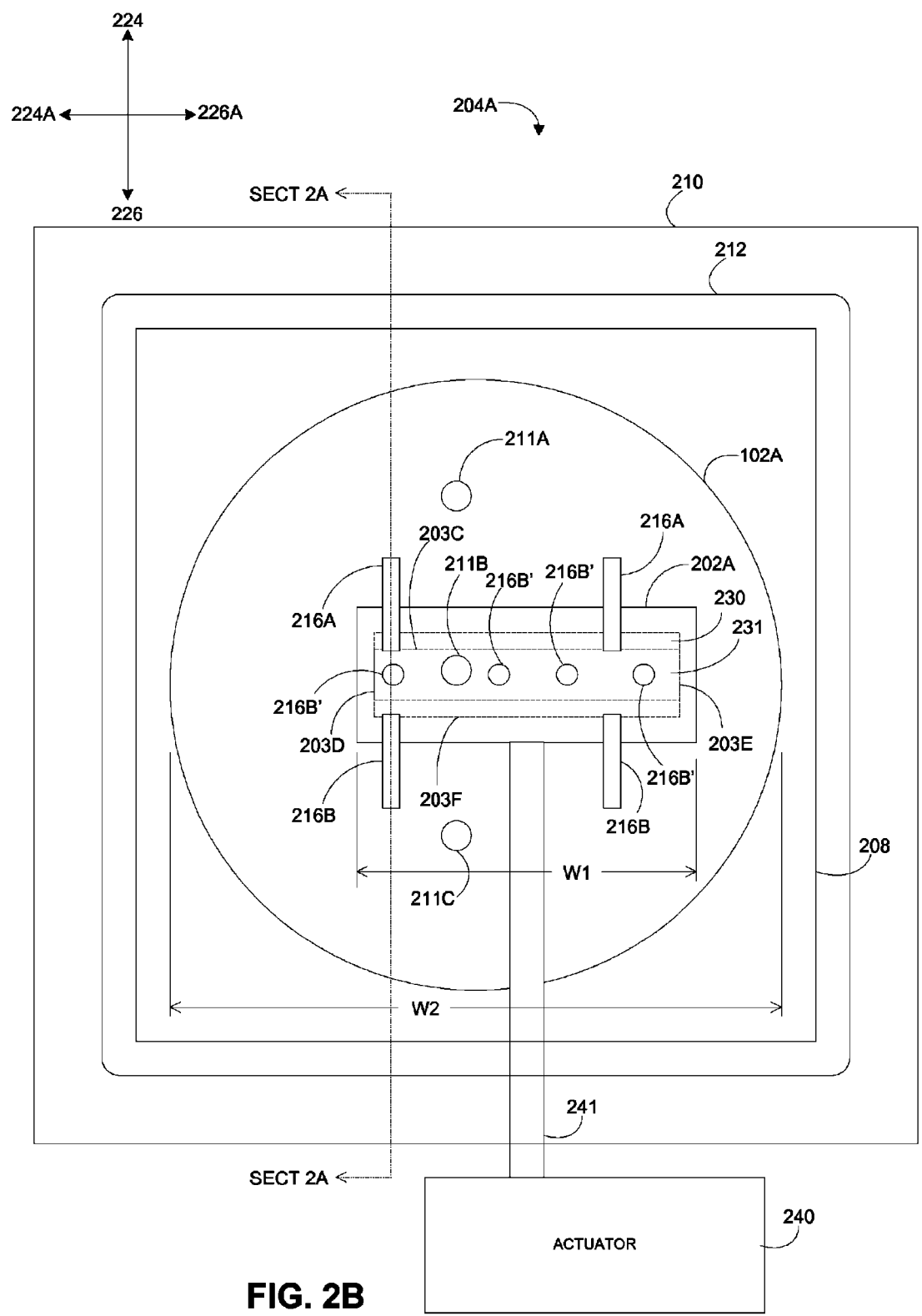
Figure 2C:
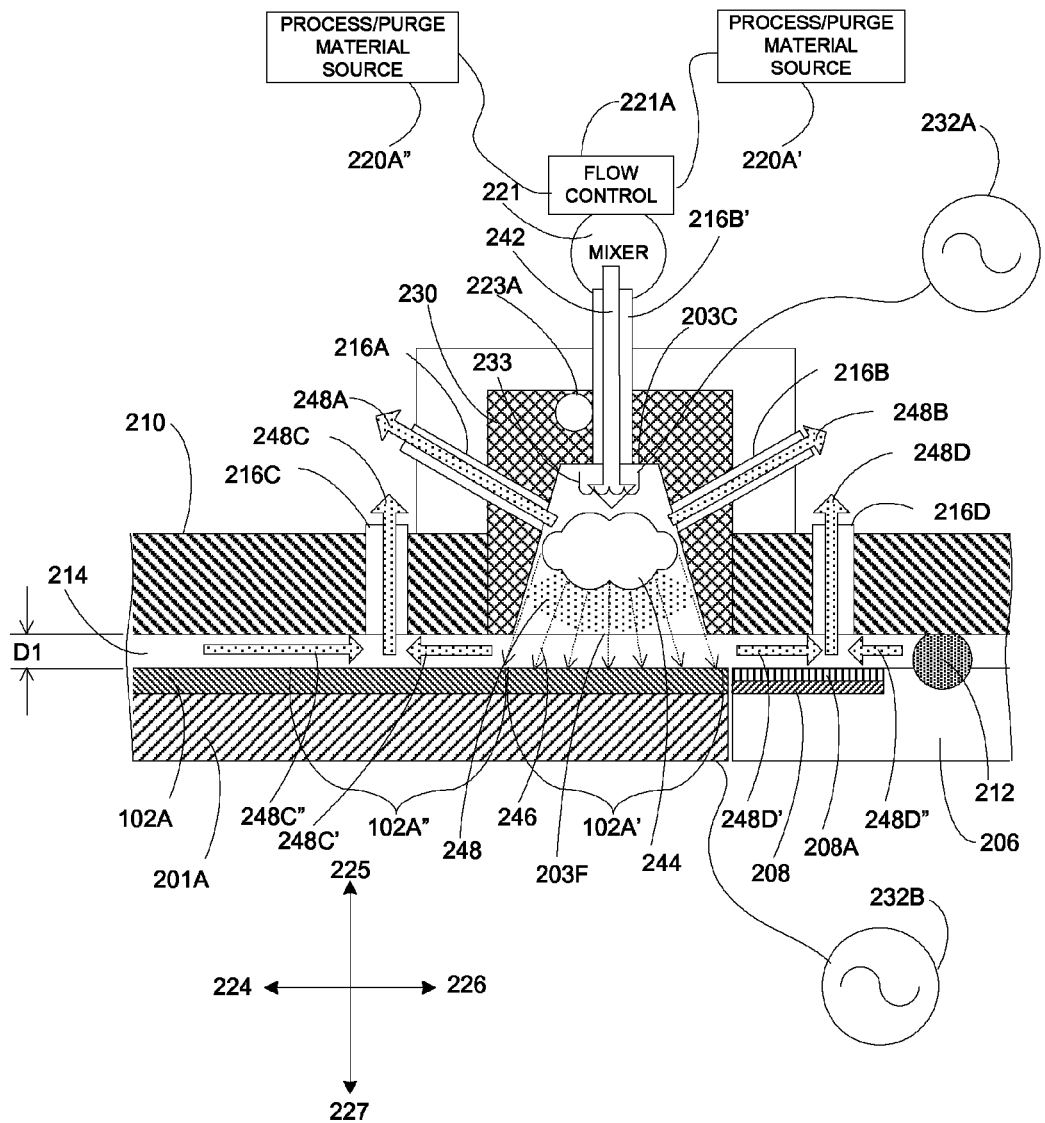

FIGS. 2A-2C show embodiments of a plasma processing system that process selected portions of a full surface of the surface being processed in accordance with embodiments of the present invention. Referring now to FIG. 2A which shows a side view of one portion of the system 204A includes a microchamber 202A formed by a housing 230 having an internal volume 231. The internal volume 231 is bounded on three sides by chamber insert 230. The fourth side 203F of the internal volume 231 is formed by a portion of the surface being processed in this instance, a portion 102A' of the surface of the semiconductor substrate 102A.

The substrate 102A is supported on a chuck 201A. The chuck 201A can have a width equal to or slightly smaller than or slightly larger than the width of the substrate 102A. The chuck 201A can be heated or cooled as may be desired for the processing of the surface of the substrate 102A. By way of example temperature control system 234 for heating or cooling is coupled to the chuck 210. The chuck 201A can also be coupled to a biasing source 232B. The chuck 201A can also be movable so as to move the substrate 102A in various directions. By way of example, the chuck 201A can rotate the substrate 102A. Alternatively or additionally, the chuck 201A can move the substrate 102A laterally relative to the microchamber 202A and the chuck can move the substrate closer or further away from the microchamber.

The microchamber 202A has multiple inlet and outlet ports 216A-216D that are coupled to process material sources or purge and vacuum sources 220A-220D. The process materials or purge are delivered to the microchamber 202A via at least one of the inlet and outlet ports 216A-216D, 216A'. As the plasma processing occurs in the microchamber 202A the plasma byproducts are drawn away from the microchamber through at least one of the inlet and outlet ports 216A-216D, 216A'.

The plasma is contained within the microchamber 202A by the physical constraints of the inner chamber surfaces and the flow of the gases within the microchamber. The microchamber 202A is sealed around the perimeter of the surface being processed by seal 212.

The microchamber 202A is movable relative to the surface of the substrate 102A being processed. The microchamber 202A can be movable or stationary and the surface of the substrate 102A being processed can be movable or stationary.

As shown in FIG. 2A, the substrate 102A has a width L1 and a cover 210 has a width L2 that is sufficiently wide or long enough that the substrate and/or the microchamber 202A can move relative to one another so that the microchamber can pass over the entire surface of the substrate and remain between the seals 212. In this manner the environment in the space 214 is controlled by the process materials and/or vacuum or gas flows provided via ports 216A-216D and 216A'.

The outlet ports 216A and 216B are located near an upper portion of the microchamber 202A so as to draw out the plasma byproducts and minimize interference with the ions flowing from the plasma to the portion 102A' of the surface of the semiconductor substrate 102A.

The precise width of the minimal space 208A can be selected according to the plasma processing being applied to the surface of the substrate. One or more ports 208B may be coupled to the minimal space 208A. A process material or purge source and/or vacuum source 220E can be coupled to the port 208B. In this manner processing material can be delivered through the minimal space 208A and/or a vacuum can be applied to the port 208B so as to aid in controlling the environment within the space 214.

Referring to FIG. 2B which shows a top view of the microchamber 202A. A portion of the cover 210 is shown cut away so as to show the edge ring 208 and the seal 212 around to the perimeter of the edge ring and the substrate 102A to be processed by the microchamber. It should be understood that the microchamber 202A is shown having a width W1 less than the width W2 of the substrate 102A be processed by the plasma, however this is merely an exemplary embodiment as will be shown in further detail in other figures that the microchamber can have several different shapes, depths, widths, lengths and configurations. It should also be understood that while the substrate 102A is shown in a substantially round shape it should be understood that this is merely an exemplary shape and that the substrate can be in any suitable or desirable shape and size. By way of example the substrate 102A can be an irregular shape or a square shape or an elliptical shape or any other shape that can be placed within a fixture so that the microchamber can be moved over the surface of the substrate 102A.

Further as shown in FIG. 2B, an actuator 240 is coupled to the microchamber 202A by a coupling arm 241. The actuator 240 is capable of moving the microchamber 202A relative to the surface of the substrate 102A. As discussed above the cover 210 can move with the microchamber 202A so as to maintain contact with and a seal to the seal 212. In this manner the microchamber 202A can move relative to the surface of the substrate 102A and at the same time maintain a controlled environment over the surface of the substrate.

The microchamber 202A can also include one or more insitu monitoring instruments 211A-D. The insitu monitoring instruments 211A-D can be optical surface scanning instruments, optical spectrum or brightness analysis instruments, or magnetic instruments or chemical analysis instruments as are well known in the art. The insitu monitoring instruments 211A-D are coupled to a system controller.

One or more of the insitu monitoring instruments 211A-D can analyze the surface of the substrate before, during and/or after processing by the microchamber 202A. By way of example, instrument 211A can measure the surface of the substrate 102A and a controller can use the measurement from instrument 211A to determine the operational parameters of a plasma process to apply to the surface of the substrate 102A.

Similarly, instrument 211C can measure the results of the plasma processing of the surface. The measured results from instrument 211C can be used by the controller to determine operational parameters and/or additional processing that may be subsequently needed for the surface of the substrate 102A.

Further, instrument 211B can measure the results of the plasma processing of the surface as the plasma is applied to the surface of the substrate. The measured results from instrument 211B can be used by the controller to determine operational parameters and/or additional processing that can be applied to the surface of the substrate 102A as the plasma is being applied to the surface of the substrate 102A.

One or more of the insitu monitoring instruments 211A-D can analyze the plasma byproducts. By way of example instrument 211D can measure the results of the plasma processing of the surface as the plasma is applied to the surface of the substrate by analyzing the plasma byproducts being output from the microchamber 202A. The measured results from instrument 211D can be used by the controller to determine operational parameters and/or additional processing that can be applied to the surface of the substrate 102A as the plasma is being applied to the surface of the substrate 102A of the substrate before, during and/or after processing by the microchamber 202A.

The insitu monitoring instruments 211A-D can be used by the controller to measure results of the plasma processing and adjust plasma operational parameters accordingly to gain the desired result. For example, the measured results from one or more of the instruments 211A-D may indicate a longer or shorter plasma processing time is needed or a greater or lesser flowrate and/or pressure of one or more plasma source materials or a change in biasing or frequency is needed or a change in temperature is needed to achieve the desired result.

The insitu monitoring instruments 211A-D can be used by the controller to detect and map local and global non-uniformities on the surface of the substrate 102A. The controller can then direct the appropriate follow-up processing to correct the detected non-uniformities. The controller can also use the detected non-uniformities to adjust the plasma operational parameters for plasma processing subsequent substrates.

The microchamber 202A may include an optical view port for one or more instruments 211A-D to perform a spectrum analysis or brightness analysis of the plasma 244 inside the microchamber 202A. One or more of the instruments 211A-D can be used to detect and endpoint of the plasma processing.

The controller can also adjust plasma operational parameters to compensate for a build-up of plasma by-products on the inner surfaces of the microchamber 202A. By way of example, one or more of the instruments 211A-D can be used to monitor the plasma and the resulting plasma byproduct build-up on the inner surfaces of the microchamber 202A. Similarly, the controller can adjust the plasma operational parameters to compensate for a build-up of plasma by-products on the inner surfaces of the microchamber 202A according to an operational sequence or a timer or a recipe in the controller or in response to a controller input (e.g., received from an operator). Adjusting the plasma operational parameters to compensate for a build-up of plasma by-products on the inner surfaces of the microchamber 202A can also include adjusting the plasma operational parameters to remove the all or a portion of the build-up of plasma by-products on the inner surfaces of the microchamber.

The controller can also adjust plasma operational parameters as the distance D1 between the microchamber 202A and the surface of the substrate 102A varies. By way of example the D1 can be adjusted for various operational reasons or physical reasons and the plasma operational parameters can be adjusted to compensate for the different distance so as to achieve the desire result.

Figure 2D:
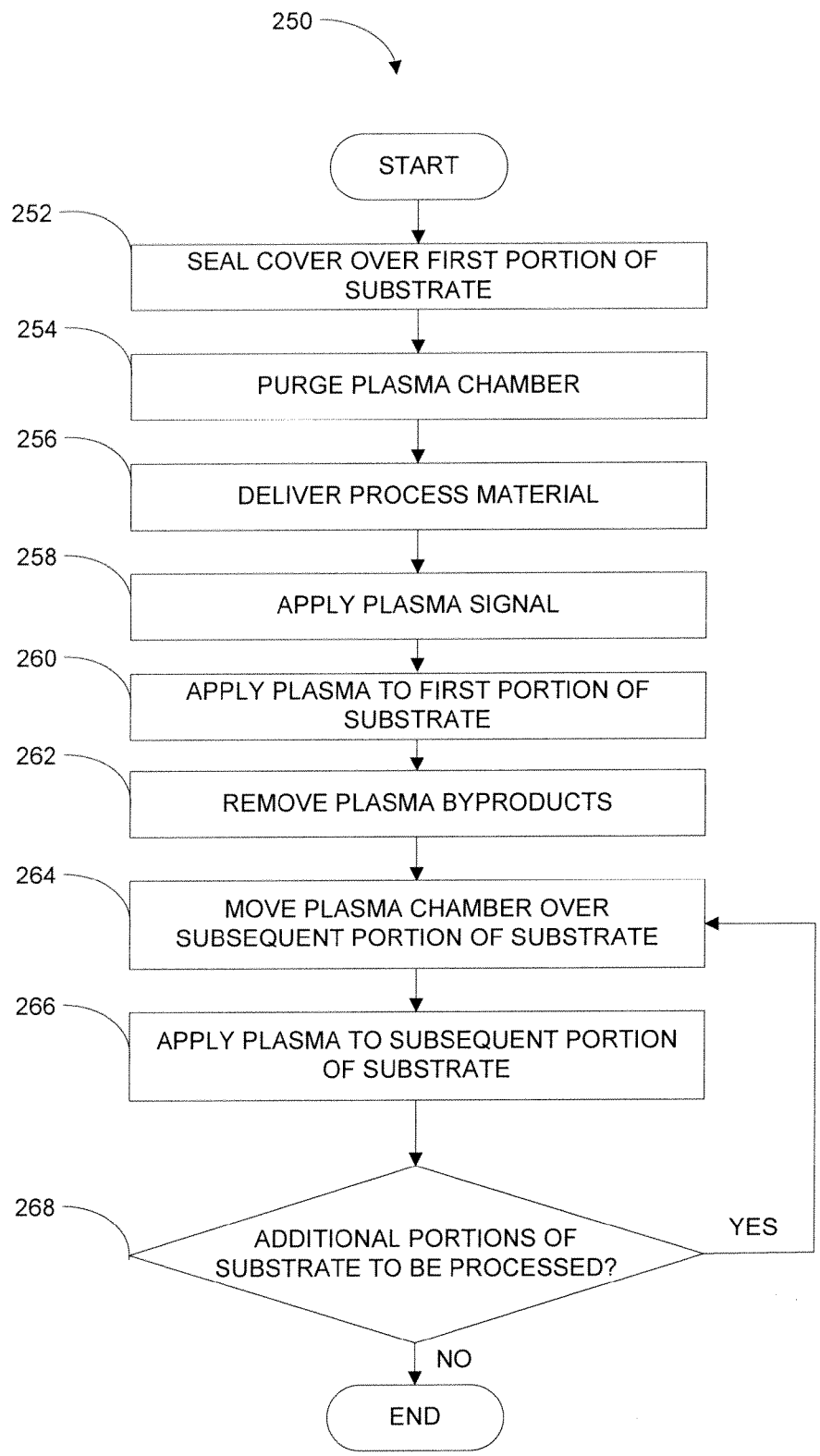
FIG. 2D is a flowchart diagram that illustrates the method operations performed in forming a plasma in the microchamber, in accordance with embodiments of the present invention.

FIG. 2C is a more detailed side view of the microchamber 202A, in accordance with embodiments of the present invention. FIG. 2D is a flowchart diagram that illustrates the method operations 250 performed in forming a plasma in the microchamber 202A, in accordance with embodiments of the present invention. The operations illustrated herein are by way of example, as it should be understood that some operations may have sub-operations and in other instances, certain operations described herein may not be included in the illustrated operations. With this in mind, the method and operations 250 will now be described. In an operation 252, the cover 210 is sealed over the substrate 102A by compressing the seal 212 between the support 206 and the cover 210. The seal 212 is compressed by moving the cover 210 in direction 227 or moving the support 206 in direction 225 so that the cover 210 in direction 227 are moved toward each other so as to compress the seal 212 between the cover 210 and the support 206.

In an operation 254, the microchamber 202A and space 214 are purged and or brought to vacuum. During a purge process, a purge material (e.g., an inert purge gas or liquid or vapor or other fluid or combinations thereof) is delivered from one or more of the process material or purge sources 220A-D and/or 220A' to at least one of the ports 216A-D and/or 216B'.

In an operation 256, a process material 242 is provided by one or more of the process material sources 220A-D and injected into the plasma chamber 202A through at least one of the ports 216A-D and/or 216B'. By way of example, the process material 242 can be provided by one or more of the process material sources 220A-D and injected into the microchamber 202A through port 216B'. Providing the process material can also include mixing two or more process materials insitu and on demand. The mixing can occur in a manifold or mixing point (not shown) outside the microchamber 202A. The mixing of the two or more plasma source materials 220A', 220A" can also occur inside the microchamber 202A.

In an operation 258, a plasma signal (typically RF or microwave) is generated by a signal source 232A and applied to the antenna/coil 233 and the chuck 201A at the desired frequency, voltage, waveform, duty cycle and current. In an operation 260 a plasma 244 generates ions 246 and heat. The ions 246 and heat that interact with the first portion 102A' of the surface of the semiconductor substrate 102A and produce plasma byproducts 248.

In an operation 262, the plasma byproducts 248 are drawn out of the microchamber 202A. The plasma byproducts 248 can be drawn out of the microchamber 202A by applying a vacuum to at least one of the ports 216A-D and/or 216B'. By way of example, a vacuum can be applied to ports 216A-D and draw plasma byproducts 248A-C out of the microchamber 202A. Drawing the plasma byproducts 248A-C out of the microchamber 202A through ports 216A-D also draws the plasma byproducts 248A-C away from the ions 246 and the portion of the surface 102A' being processed or exposed to plasma 244. Removing the plasma byproducts 248 from the microchamber 202A reduces the possibility of the plasma byproducts interfering with the ions 246 contacting the selected portion 102A' of the surface of the substrate 102A. Removing the plasma byproducts 248 from the microchamber 202A reduces the possibility of the plasma byproducts attaching to the inner surfaces 203A-C of the microchamber 202A. If the plasma byproducts 248 attach to and build up on the inner surfaces 203A-C of the microchamber 202A. Such buildup can change the architecture and overall shape of the microchamber which can cause changes in plasma 244 density and distribution within the microchamber and more specifically change the plasma density applied to the surface of the substrate 102A.

In an operation 264, the microchamber 202A can be moved in at least one of directions 224, 224A, 226 and/or 226A relative to the substrate 102A until a subsequent portion 102A" of the surface of the substrate is aligned with the microchamber. The microchamber 202A is then formed by the inner surfaces 203A-E and the second portion 102A" of the surface of the substrate 102A and the plasma is applied to the subsequent portion 102A" of the surface of the substrate 102A in an operation 266.

In an operation 268, if there are additional portions of the surface of the substrate to be processed, the method operations continue in operations 264-266 as described above. If there are no additional portions of the surface of the substrate to be processed, the method operations end.

An edge platform or edge ring 208 can also be included as shown in FIGS. 2A-2C. The edge ring or platform 208 provides additional processing surface where the microchamber 202A can be located during an initial plasma phase and a shut down of the plasma or any other time when the plasma can be operated but it is not desired to have the plasma in contact with the surface of the substrate 102A.

The edge ring or platform 208 is separated from the surface of the substrate 102A by a minimal space 208A. The edge ring or platform 208 can be adjacent to the entire perimeter of the substrate 102A, as shown. Alternatively, the edge ring or platform 208 can be adjacent to only one or more portions of the perimeter of the substrate. The edge ring or platform 208 can be used with any shape substrate whether the substrate is round, rectangular or some other shape (irregular, any polygon, etc.). A partial edge ring or platform 208 is described in more detail in commonly owned U.S. Pat. No. 7,513,262, entitled "Substrate Meniscus Interface and Methods for Operation" by Woods, which is incorporated by reference herein, in its entirety and for all purposes.

The edge ring or platform 208 can perform several functions. One function is a microchamber starting, stopping and "parking" location for the microchamber or other processing chamber as described in U.S. Pat. No. 7,513,262.

Another function is to reduce the concentration of the plasma 244 on the edge of the substrate 102A. Without the edge ring 208, as a microchamber passes onto the edge of the substrate 102A, the volume of the microchamber would change considerably because the distance to that side of the microchamber formed by the substrate would change by the thickness of the substrate 102A. This change in microchamber volume will change the plasma concentration of ions and even the plasma shape.

Further, as the microchamber passes onto the edge of the substrate 102A, the ions 246 emitted from the plasma 244 and be focused on the relatively small area of the edge of the substrate 102A. As a result the reactivity of the ions 244 will also be focused on the relatively small area of the edge of the substrate 102A and the relative processing activity would be greatly increased on the edge of the substrate 102A as compared to other portions of the surface of the substrate.

With the edge ring or platform 208 maintained at substantially the same potential as the substrate, the edge ring or platform 208 also maintains a substantially constant microchamber plasma volume and a substantially constant ion concentration as the plasma transitions from the edge ring or platform across the edge of the substrate 102A and fully onto the surface of the substrate 102A.

The controller can also adjust the plasma parameters as the microchamber 202A passes over and processes the edge of the substrate. Typically, the edge of the substrate includes a bevel edge portion that is not typically used as part of the active device structures as it is used for handling the substrate. Further, the bevel edge is typically rounded or beveled and as such can change the volume of the microchamber as the bevel edge passes through the microchamber. As a result the controller can also adjust the plasma parameters as the microchamber to process the bevel edge to achieve the desired result.

The edge ring 208 can be a sacrificial material that is processed by the microchamber similar to the processing of the substrate 102A. The edge ring can include multiple layers or portions. By way of example the edge ring 208 can include a layer 208A. The layer 208A may be sacrificial and the remaining portion of the edge ring substantially resistant to the plasma processing of the microchamber. Alternatively, the layer 208A may be substantially impervious or resistant to the plasma processing of the microchamber.

The microchamber 202A can also include an insitu mixing point or manifold 221 where two or more plasma source materials 220A', 220A" can be mixed as needed for use in the microchamber 202A. The insitu mixing point or manifold 221 can also include flow metering systems 221A for controlling the quantity, flowrate and pressures of the plasma source materials 220A', 220A" so that the desired mixture can be created immediately before the mixture is input to the microchamber 202A.

The microchamber 202A can also include a temperature control system 223A. The temperature control system 223A can heat or cool the microchamber 202A and/or the plasma source materials 220A' in the microchamber. In this way the temperature of the microchamber 202A and/or the plasma source materials 220A' can be controlled.

While the described and illustrated embodiments are shown in a horizontal orientation, it should be understood that the microchamber 202A and be operated in any orientation. By way of example, the microchamber 202A and be operated in an inverted orientation. The microchamber 202A and be operated in a vertical orientation or in any angle between horizontal and vertical.

The substrate 102A can be rotated by the chuck 210 so that the microchamber 202A can be passed over a first portion of the surface of the substrate (e.g., a first half or a first quadrant or other portion). Then the substrate 202A can be rotated so that the microchamber 202A can be passed over a subsequent portion of the surface. The microchamber 202A may be moved less in this manner as the rotated substrate may allow the microchamber to move in an opposite direction for processing the second portion from the direction it moved while processing the first portion of the surface of the substrate. This can reduce the overall size of the cover 210 as the cover will not need to be larger than twice the width of the substrate and can be possibly only slightly larger than about the width of the substrate 102A.

II. Microchambers

FIGS. 3A-3F show detailed cross-sectional views of microchambers 202A.1-202A.6, in accordance with embodiments of the present invention. The microchambers 202A.1-202A.6 have various locations, numbers and arrangements of inlet and outlet ports 216A, 216B, 216A', 216B', 216A", 216B". The microchambers 202A.1-202A.6 also have various cross-sectional shapes. It should be understood these are merely exemplary shapes and port arrangements and combinations and fewer or greater numbers of ports can also be included. The angles formed by the inlet and outlet ports 216A, 216B, 216A', 216B', 216A", 216B" relative to a centerline 305, as shown, are merely exemplary and the inlet and outlet ports may be angled differently than shown and in any suitable angle.

By way of example, microchamber 202A.1 includes two outlet ports 216A, 216B and one inlet port 216B'. One outlet port 216A in a first side 203A is near a top portion 203C of the microchamber 202A.1. Inlet port 216B' is located in the top portion 203C of the microchamber. A second outlet port 216B is located further away from the top portion 203C in a side 203B substantially opposite from the first side 203A.

With regard to shape: microchamber 202A.1 has a substantially trapezoidal cross-sectional shape; microchamber 202A.2 has a substantially triangular cross-sectional shape; microchamber 202A.3 has a rounded substantially triangular cross-sectional shape; microchamber 202A.4 has a substantially rectangular cross-sectional shape; microchamber 202A.5 has a substantially U-cross-sectional shape; microchamber 202A.6 has a substantially rectangular cross-sectional shape with rounded corners.

Figure 3A:
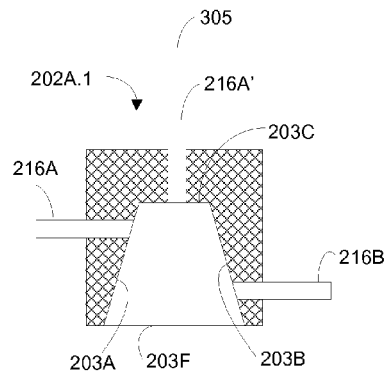
FIGS. 3A-3F show detailed cross-sectional views of microchambers, in accordance with embodiments of the present invention.
Figure 3B:
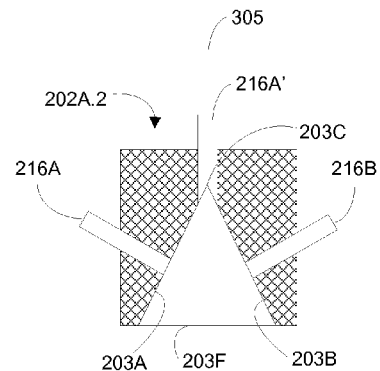
Figure 3C:
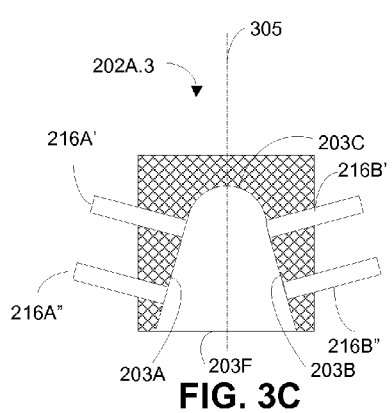
Figure 3D:
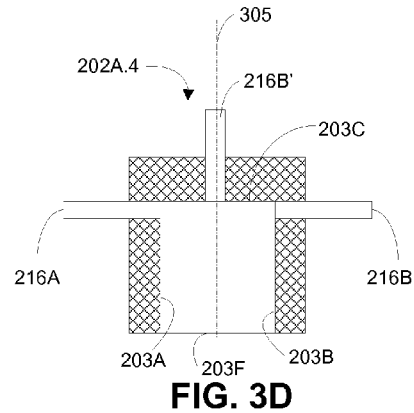
Figure 3E:
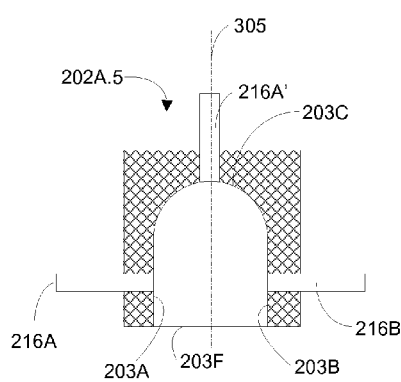
Figure 3F:
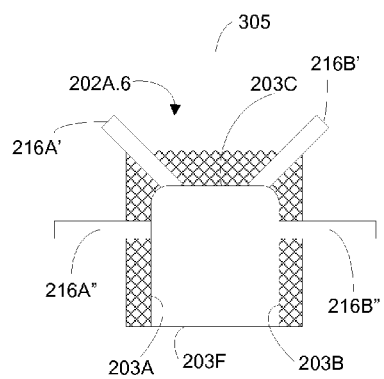

In a further example, the illustrated combination and shapes of the microchambers 202A.1-6 and the corresponding arrangement of the inlet and outlet ports 216A, 216B, 216A', 216B', 216A", 216B" are merely exemplary combinations. By way of example the microchamber 202A.5 shown in FIG. 3E can include the port arrangement as shown in FIG. 3F or any combination of port arrangements. In addition to shape, the size can also be varied, to provide for more or less volume in the microchambers.

Figure 3G:
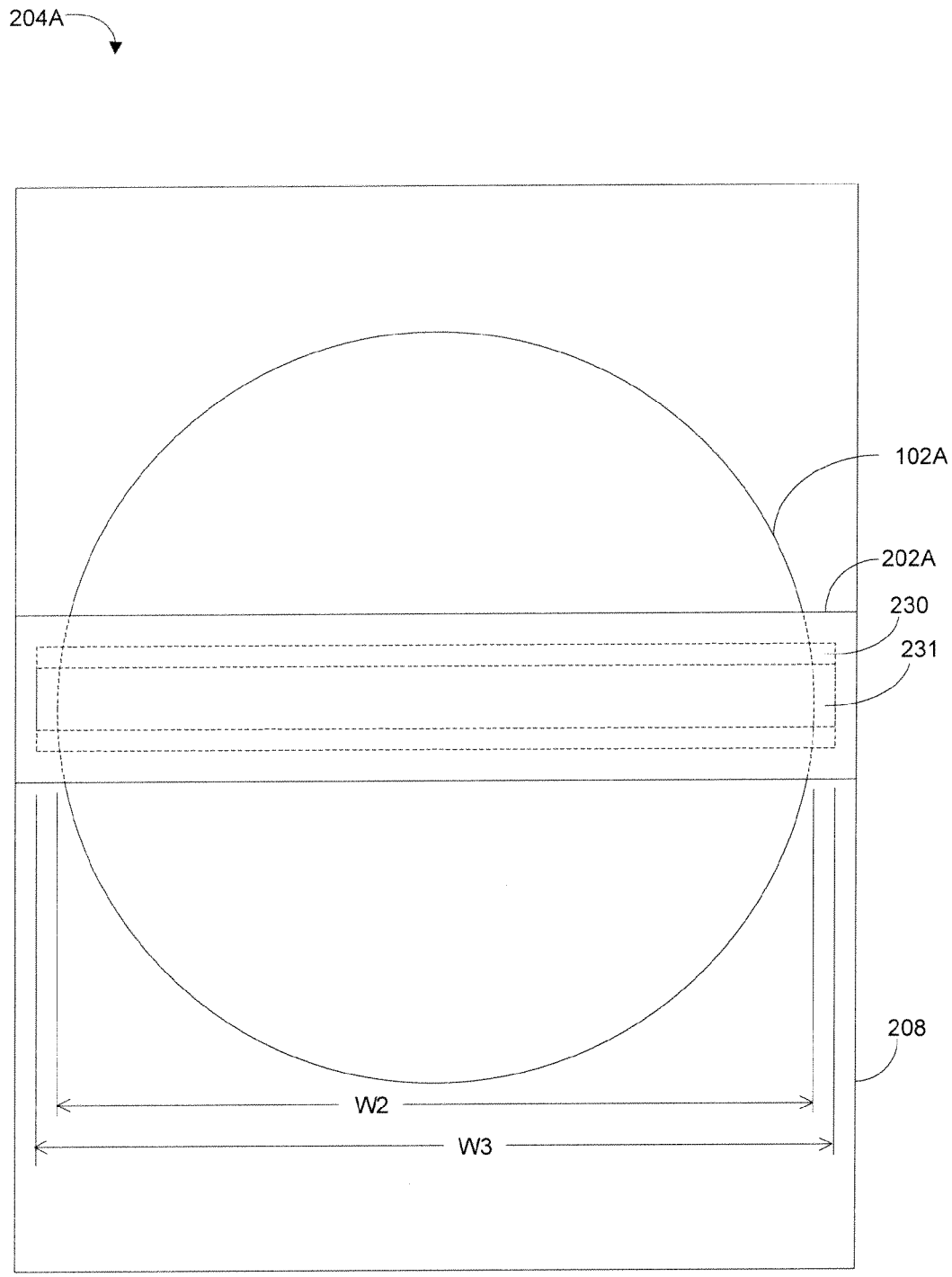
FIG. 3G is a top view of a microchamber, in accordance with embodiments of the present invention.

FIG. 3G is a top view of a microchamber 202A, in accordance with embodiments of the present invention. The microchamber 202A is similar to the microchambers described above and having a width W3 equal to or greater than width W2 of the substrate 102A.

Figure 3H:
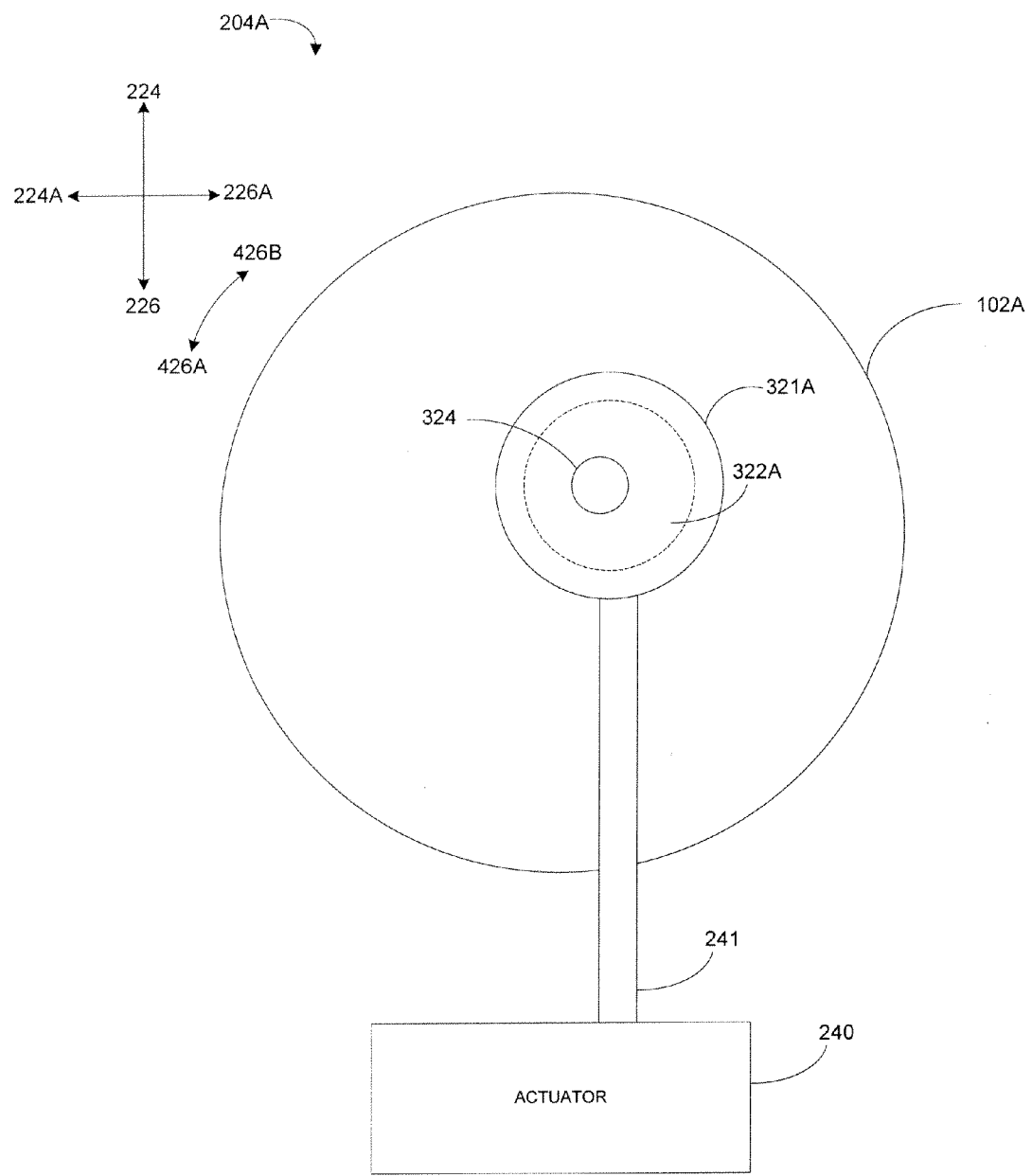
FIG. 3H is a top view of a microchamber, in accordance with embodiments of the present invention.

FIG. 3H is a top view of a microchamber 321A, in accordance with embodiments of the present invention. Microchamber 321A is similar to the microchamber 202A shown in FIG. 2B except the microchamber 321A is substantially round. Microchamber 321A can also include an instrument 324 to monitor the operation of the microchamber.

Figure 3I:
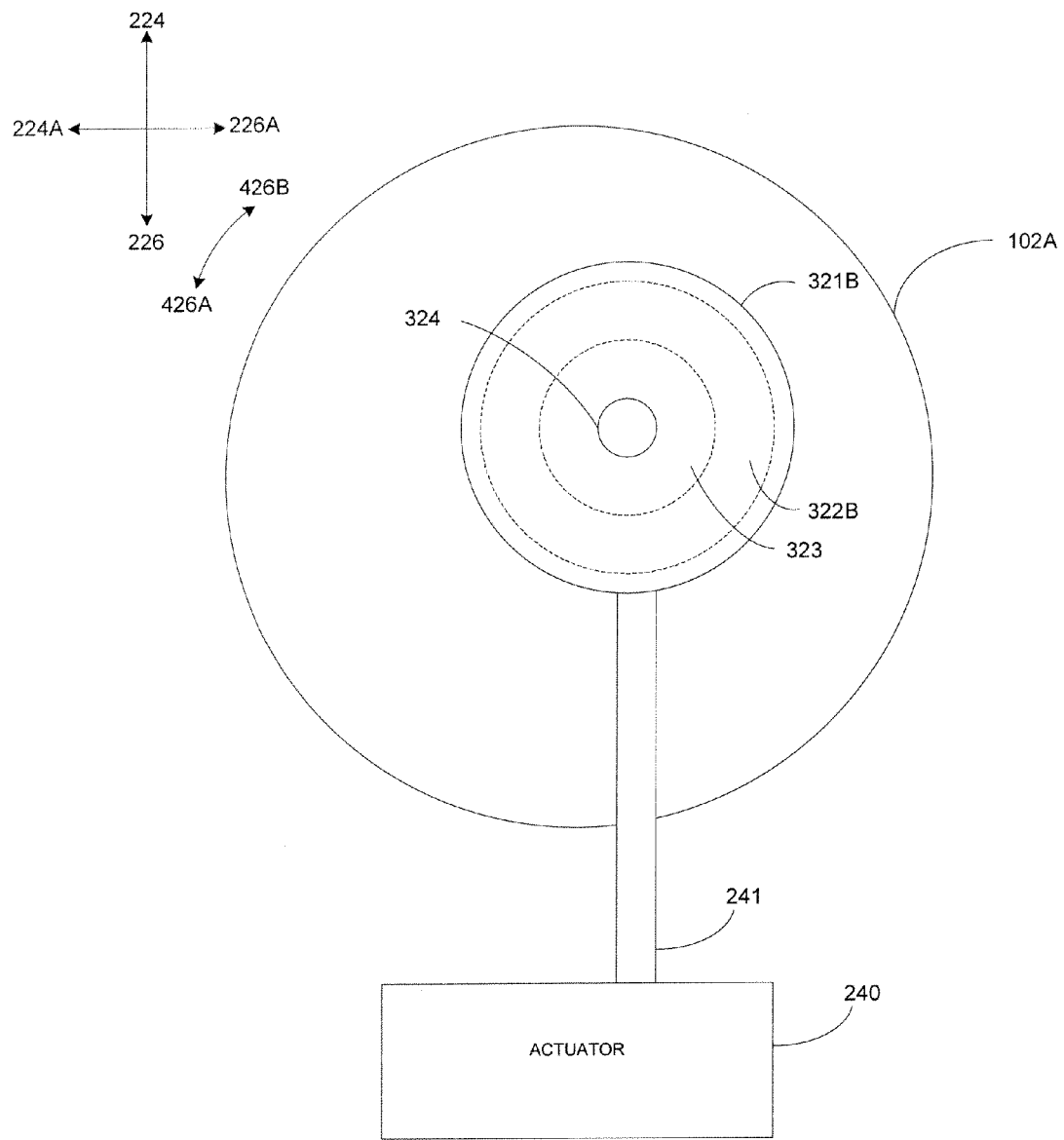
FIG. 3I is a top view of a microchamber, in accordance with embodiments of the present invention.

FIG. 3I is a top view of a microchamber 321B, in accordance with embodiments of the present invention. Microchamber 321B is similar to the microchamber 321A shown in FIG. 3H except the microchamber 321B is an annular microchamber forming a plasma in a substantially annular region 322B. Only the corresponding annular portion 302A of the surface of the substrate 102A is exposed to the plasma in the annular microchamber 321B. The microchamber 321B can also include an instrument 324 to monitor the operation of the microchamber.

Figure 3J:
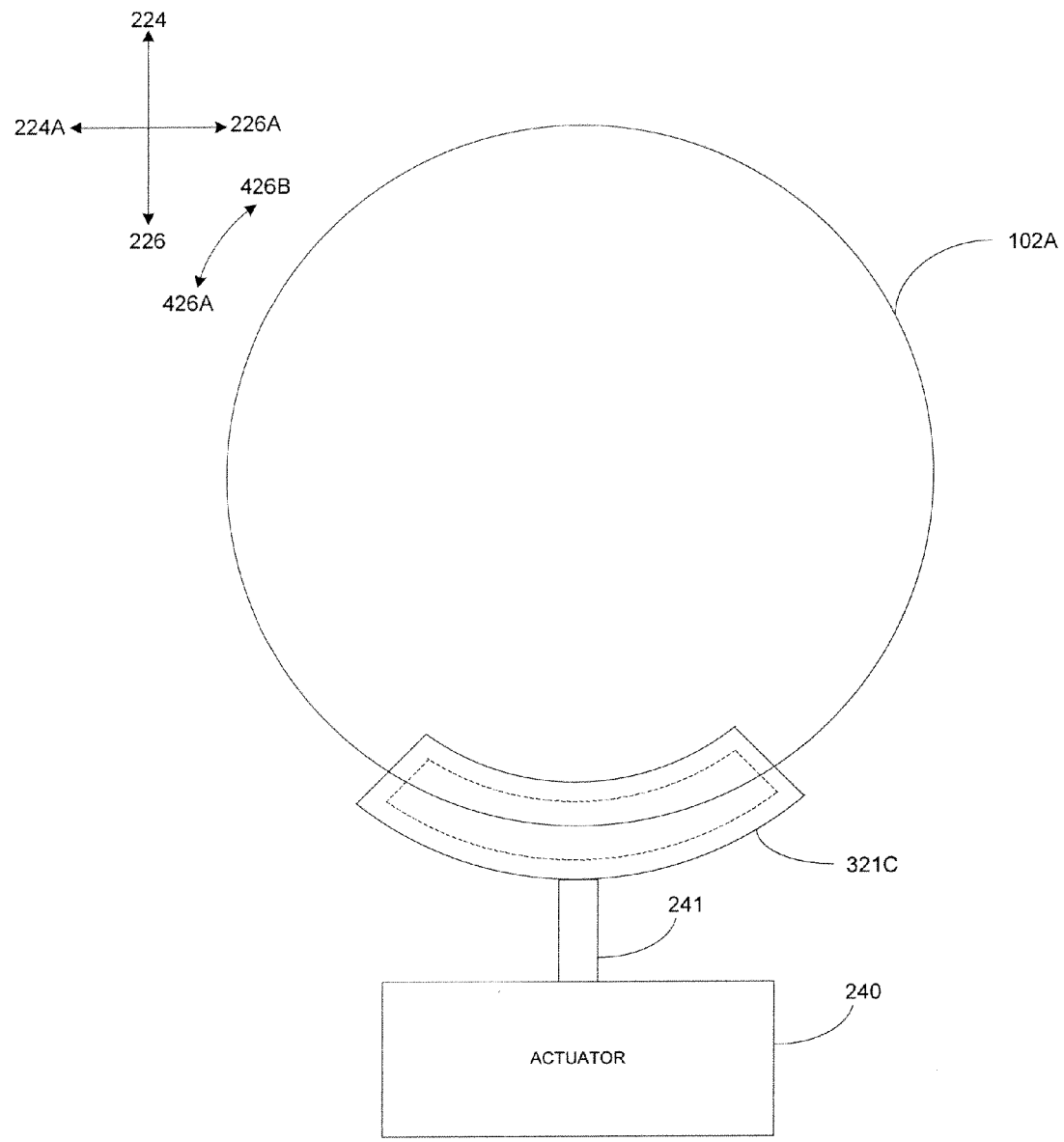
FIG. 3J is a top view of a microchamber, in accordance with embodiments of the present invention.

FIG. 3J is a top view of a microchamber 321C, in accordance with embodiments of the present invention. Microchamber 321C has an arced shape similar to but not necessarily the same curve as a portion of a curved edge of the substrate 102A. This allows for etch preparation of the wafer edge, such as to remove byproducts or buildups. This edge processing can also be done after full wafer processing is completed and in conjunction with other wafer clean operations.

Figure 3K:
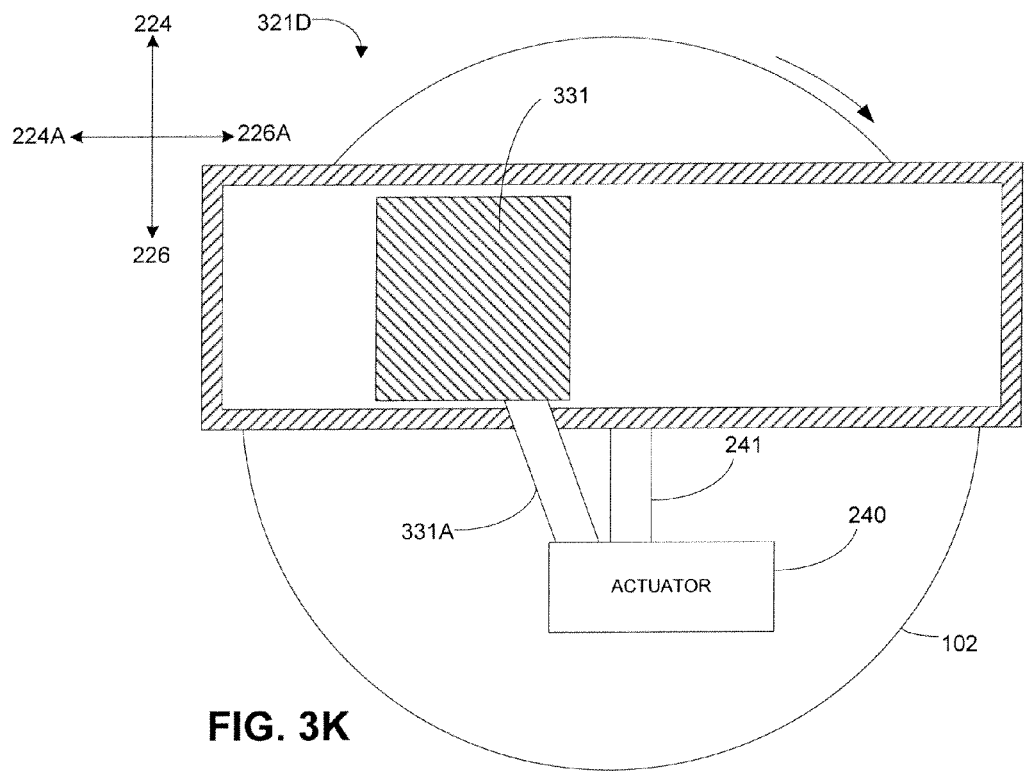
FIG. 3K is a top view of a microchamber, in accordance with embodiments of the present invention.

FIG. 3K is a top view of a microchamber 321D, in accordance with embodiments of the present invention. Microchamber 321D is substantially similar to microchamber 202A as shown in FIG. 2B above, however the microchamber 321D also includes a partial masking plate 331. The partial masking plate 331 can selectively mask a portion of the surface of the substrate 102A from the plasma in the microchamber 321D. The partial masking plate 331 can be fixed or movable relative to the microchamber 321D. The actuator 240 can be coupled to the partial masking plate 331 by a coupling arm 331A.

Figure 3L:
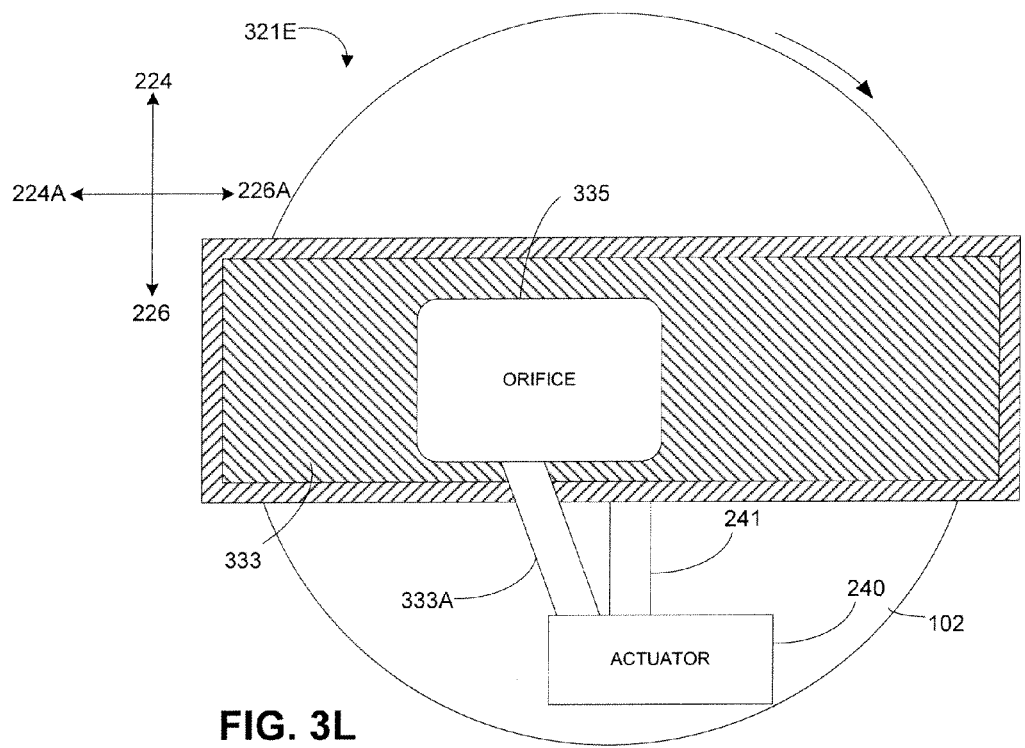
FIG. 3L is a top view of a microchamber, in accordance with embodiments of the present invention.

FIG. 3L is a top view of a microchamber 321E, in accordance with embodiments of the present invention. Microchamber 321E is substantially similar to microchamber 321D as shown in FIG. 3K above, however the microchamber 321E also includes a full masking plate 333. The full masking plate 333 includes an opening 335 that can selectively expose a portion of the surface of the substrate 102A to the plasma in the microchamber 321E. The full masking plate 333 can be fixed or movable relative to the microchamber 321E. The actuator 240 can be coupled to the full masking plate 333 by a coupling arm 333A.

Figure 3M:
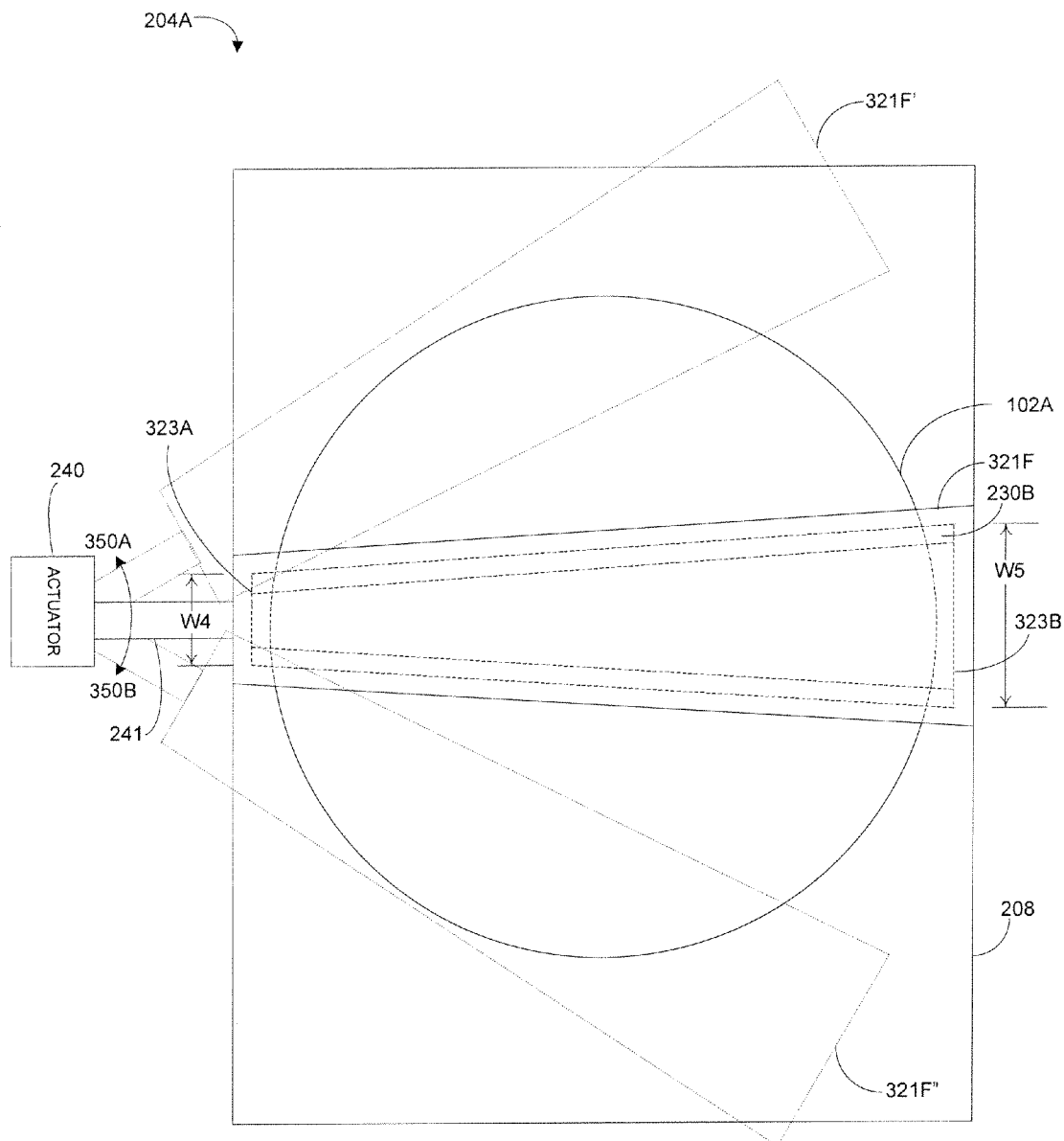
FIG. 3M is a top view of a microchamber, in accordance with embodiments of the present invention.

FIG. 3M is a top view of a microchamber 321F, in accordance with embodiments of the present invention. Microchamber 321F is substantially similar to microchamber 202A as shown in FIG. 3G above, however the microchamber 321F has a fan-like shape having a narrow first end 323A having a width W4 and an opposite second end 323B, having a width W5, where W5 is wider than W4. W5 can be only slightly wider than W4 (e.g., W5=101% of W4). W5 can also be multiples of W4 (e.g., W5+n*W4 where n=any multiple, not necessarily an integer value between about 2 and about 20). The ratio of W4 and W5 can be a function of a rotation of the substrate around a rotary table as will be described in more detail below so that the residence time of the substrate 102A at the first end 323A is substantially the same as the residence time at the second end 323B.

Microchamber 321F is coupled to an actuator 240 by coupling arm 241. Actuator 240 can pivot microchamber 321F in directions 350A, 350B to move the microchamber into positions 312F' to 312F" and even further so that the microchamber can be pivoted completely off of the substrate 102A. In this manner the microchamber can be pivoted over the entire surface of the substrate 102A.

Figure 3P:
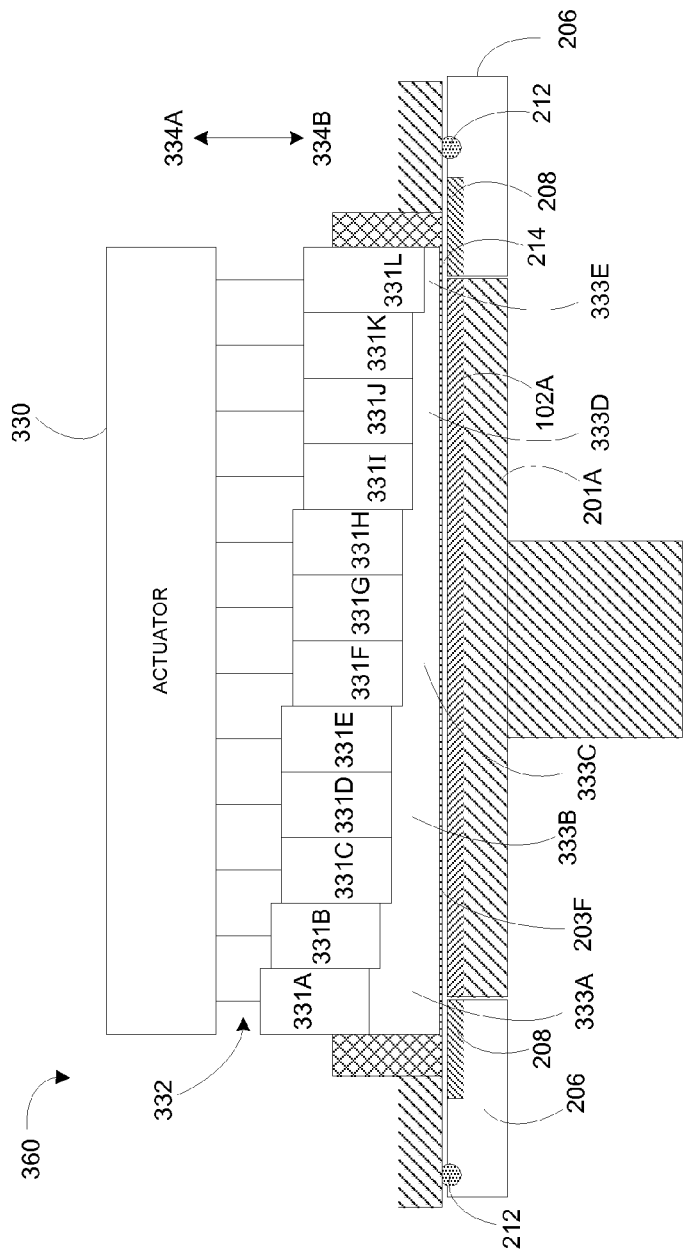

FIGS. 3N-3P are lengthwise cross-sectional views of microchambers 321G, 321H and 335, respectively, in accordance with embodiments of the present invention. Microchamber 321F has a constant depth D1 throughout the length of the microchamber. The depth of microchamber 321G varies along the length from a depth D1 at a first end 313A to a depth D2 at a second end 313B. The depth of microchamber 321G can be constant throughout a first portion 313C of the microchamber and then vary along a second portion 313D.

As shown in FIG. 3P, microchamber 335 has a variable depth and shape along the length of the microchamber. The microchamber 335 includes multiple depth and shape adjusters 331A-331L. The depth and shape adjusters 331A-331L are coupled to an actuator 330 by links 332. The depth and shape adjusters 331A-331L can be moved in direction 334A or 334B by actuator 330 to adjust a depth and shape of a corresponding portion 333A-333E of the microchamber. The depth and shape adjusters 331A-331L can be moved laterally (e.g., into and out of the plane of the view shown in FIG. 3P) to vary the depth and shape of the microchamber 335. The depth and shape adjusters 331A-331L can be biased at a desired potential or electrically isolated from the various potentials within the microchamber 335. The depth and shape adjusters 331A-331L can be any suitable material or shape. The depth and shape of the microchamber 335 can be adjusted to as desired to provide the desired plasma exposure to the surface of the substrate 102A.

III. Multiple Chamber and Combination Chamber Head

Figure 4A:
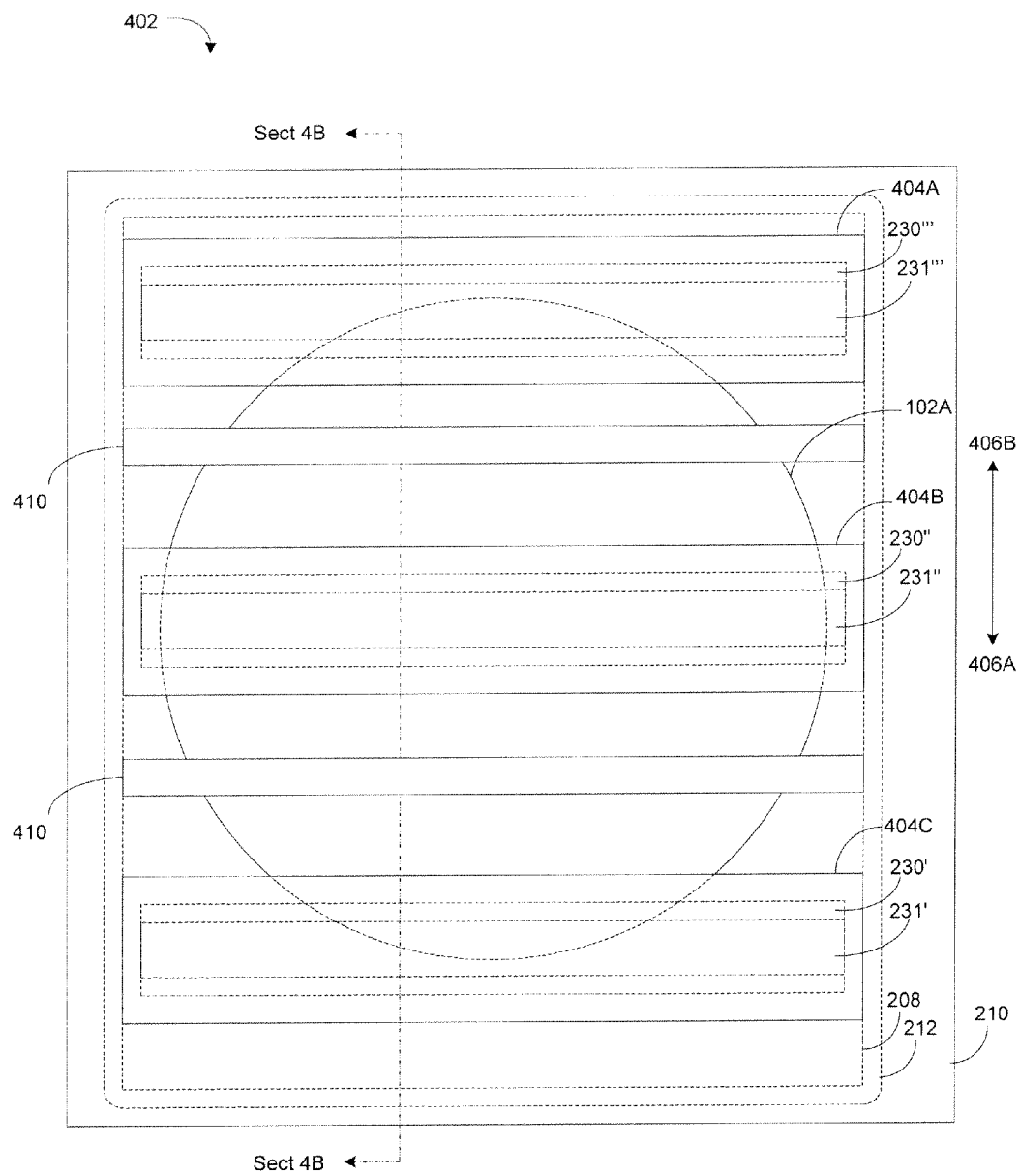
FIGS. 4A-4C show a single processing head with multiple microchambers, in accordance with embodiments of the present invention.
Figure 4B:
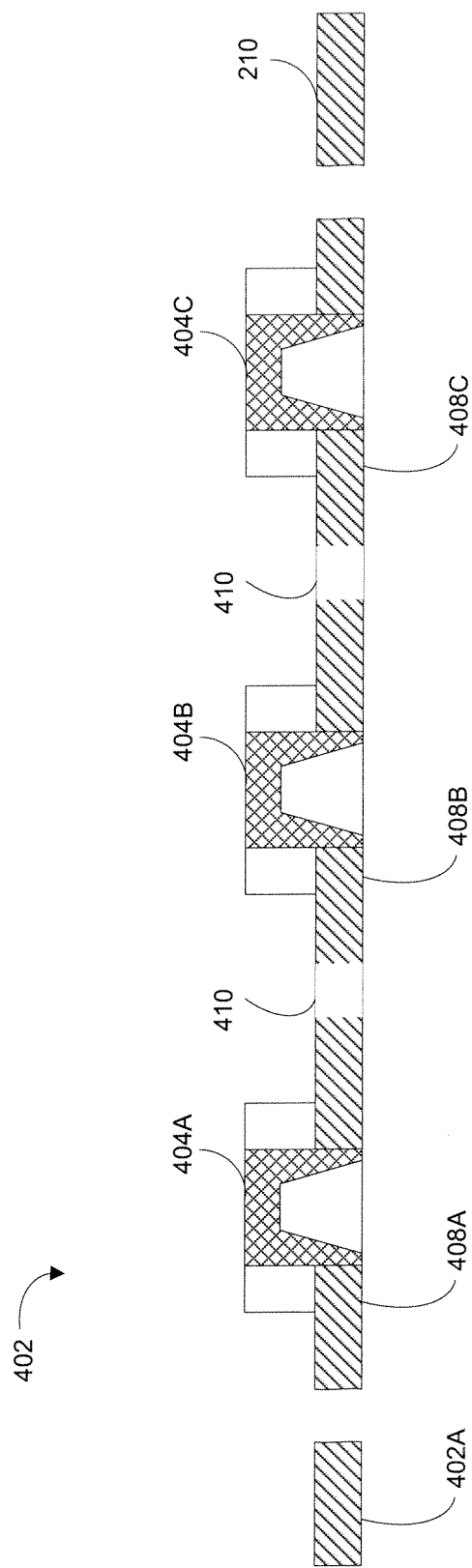
Figure 4C:
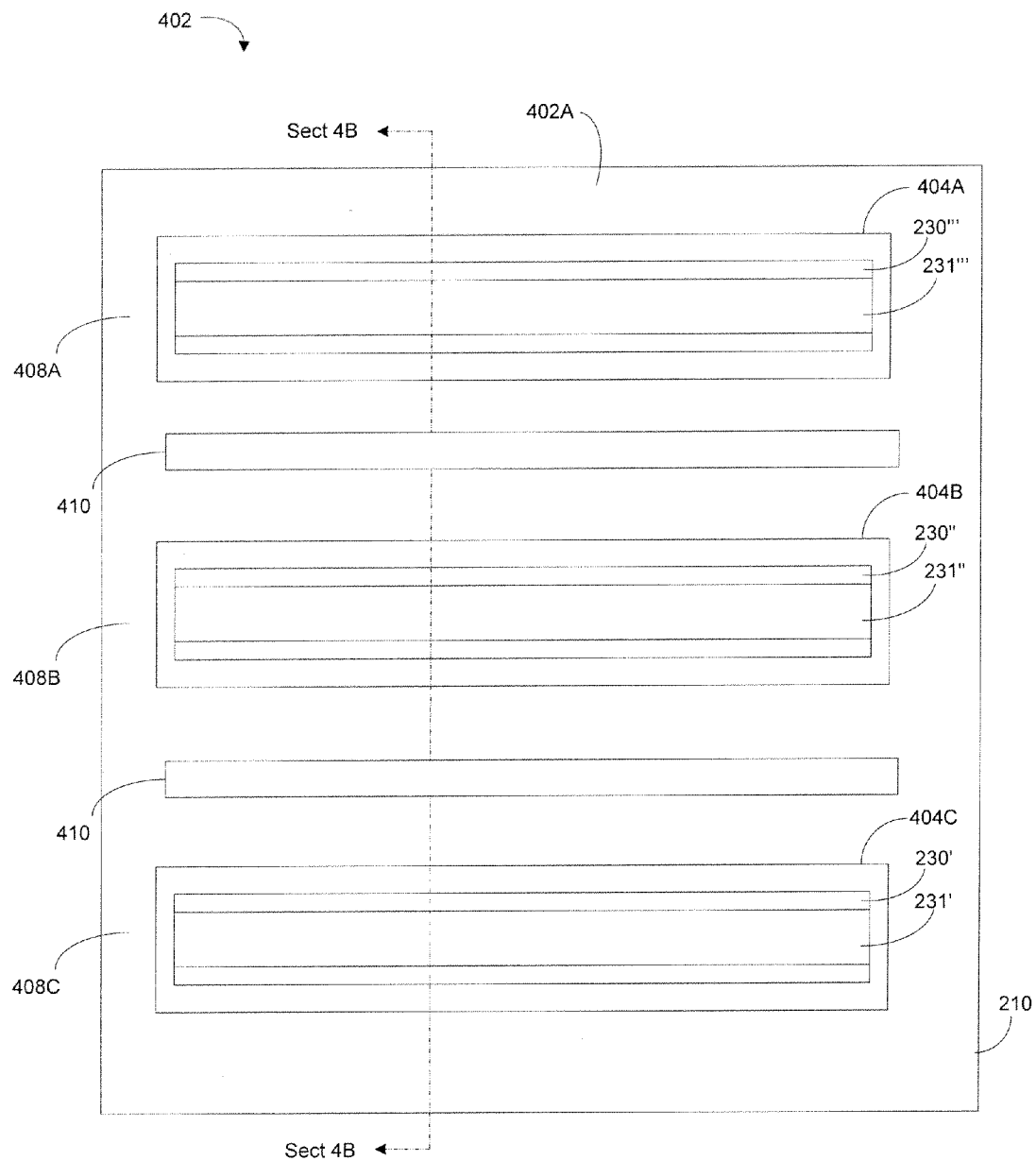

FIGS. 4A-4C show a single processing head 402 with multiple microchambers 404A-C, in accordance with embodiments of the present invention. FIG. 4A is a top view of the processing head 402. FIG. 4B is a side sectional view of the processing head 402. FIG. 4C is a bottom view of the processing head 402.

Referring now to FIGS. 4A and 4B, the processing head 402 includes three processing chambers 404A-C. The processing head 402 can move in directions 406A and 406B relative to the substrate 102A such that each of the processing chambers 404A-C can be passed fully across the top surface of the substrate 102A. The processing head 402 and the substrate 102A can move in the same direction at different speeds. Alternatively, the processing head 402 and the substrate 102A can move in different directions the same or different speeds. Each of the each of the processing chambers 404A-C can apply a corresponding process to the surface of the substrate 102A.

The processing chambers 404A-C are shown as being substantially similar in size, shape, distribution and function, however it should be understood that each one of the processing chambers may have a different size, shape and function. It should also be understood that each processing head 404 can include any number from one or more processing chambers.

Processing chamber 404A may have a different length, width and/or depth as compared to the other processing chambers 404B, 404C. For example, processing chamber 404A may have a width less than the width of the substrate and processing chambers 404B and 404C have a width equal to or greater than the width of the substrate.

Processing chamber 404A may have a different shape, e.g., rectangular, rounded, annular, etc. as compared to the other processing chambers 404B, 404C. For example, processing chamber 404A may have a rectangular shape and processing chambers 404B and 404C have an oval or a rounded shape.

Processing chambers 404A-404C can be distributed differently around the processing head 402. For example, processing chamber 404A may be located near an edge of the processing head 402 and processing chambers 404B and 404C are distributed in uneven spacing about the processing head.

Processing chamber 404A may have a different function, e.g., plasma etch, plasma cleaning, passivation, non-plasma cleaning and or rinsing, etc. as compared to the other processing chambers 404B, 404C. For example, processing chamber 404A may have a passivation function and processing chambers 404B and 404C have different plasma etching functions. In another example, one or more of the processing chambers 404A-404C can be a proximity head cleaning station as described in more detail in commonly owned U.S. Pat. No. 7,198,055, entitled "Meniscus, Vacuum, IPA Vapor, Drying Manifold" by Woods, and U.S. Pat. No. 7,234,477, entitled "Method and apparatus for drying semiconductor wafer surfaces using a plurality of inlets and outlets held in close proximity to the wafer surfaces" by de Larios et al., and U.S. Pat. No. 7,069,937 B2, entitled "Vertical Proximity Processor" by Garcia et al, and U.S. Pat. No. 6,988,327, entitled "Methods and Systems for Processing a Substrate Using a Dynamic Liquid Meniscus" By Garcia et al, and the progeny and related applications and patents, all of which are incorporated by reference herein, in their entirety and for all purposes.

Referring now to FIG. 4C, the processing head 402 includes three processing chambers 404A-C. The processing chambers 404A-C appear as openings in the corresponding regions 408A-408C of the substantially flat bottom surface 402A of the processing head 402.

The processing head 402 can also include a barrier system 410 separating each processing chamber from the adjacent processing chamber. The barrier system 410 can be physical barrier such as a seal or an electrical or magnetic field or a gas curtain and/or vacuum curtain or other fluid barrier.

Multiple processing chambers 404A-404C in the single processing head 402 allows different processes to be conducted in each processing chamber. Further, one processing chamber may be used while a second processing chamber is cleaned without interrupting throughput.

Figure 4D:
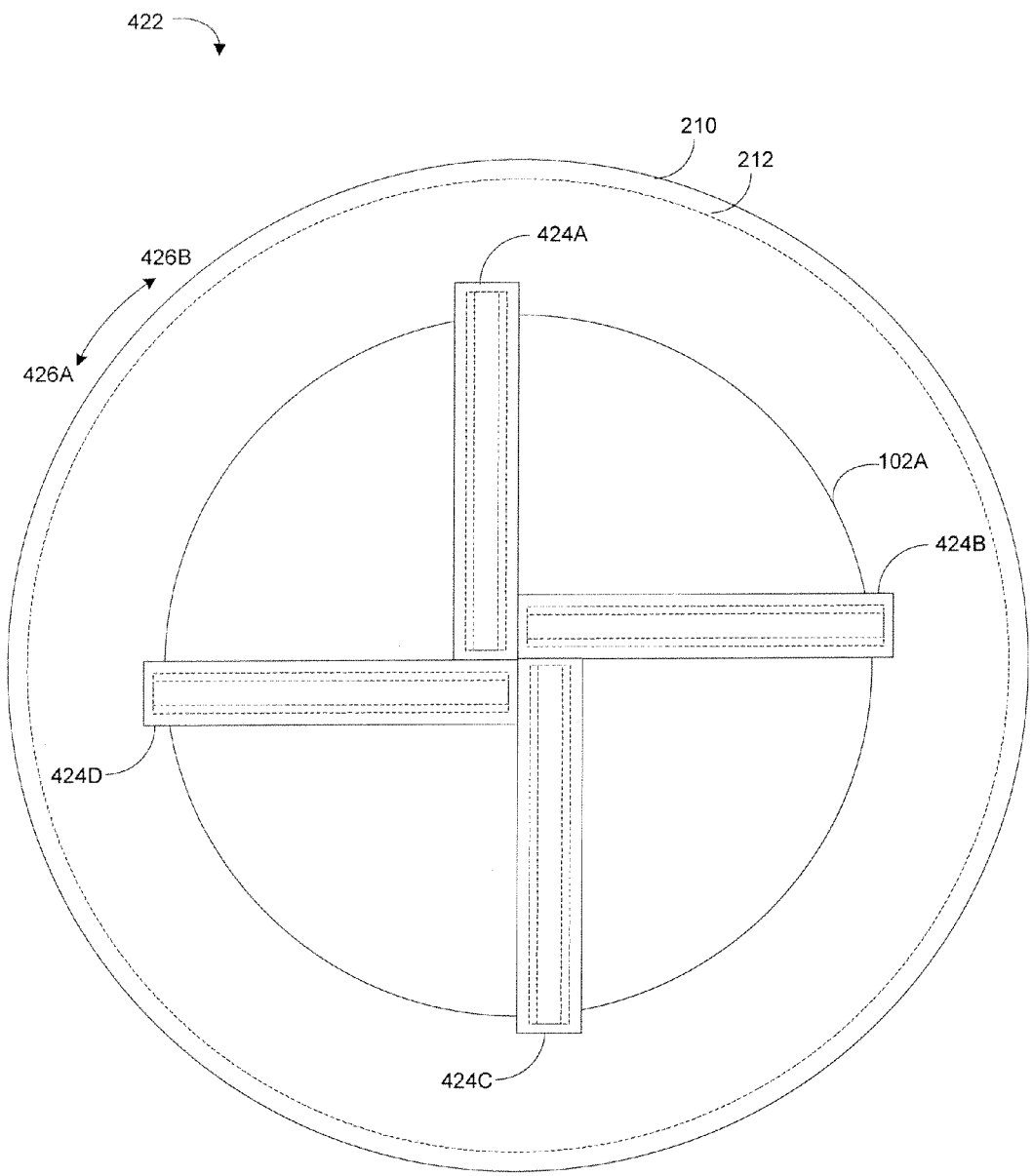
FIG. 4D shows a single processing head with multiple microchambers, in accordance with embodiments of the present invention.

FIG. 4D shows a single processing head 422 with multiple microchambers 424A-D, in accordance with embodiments of the present invention. The processing head 422 can rotate relative to the substrate 102A and thus pass the surface of the substrate 102A under at least one of the processing chamber in as little as a quarter turn (90 degree rotation). The processing head 422 and/or the substrate 102A can rotate in directions 426A and/or 426B. The processing head 422 and the substrate 102A can rotate in the same direction at different speeds. Alternatively, the processing head 422 and the substrate 102A can rotate in opposing directions 426A and/or 426B at the same or different speeds.

Figure 5:
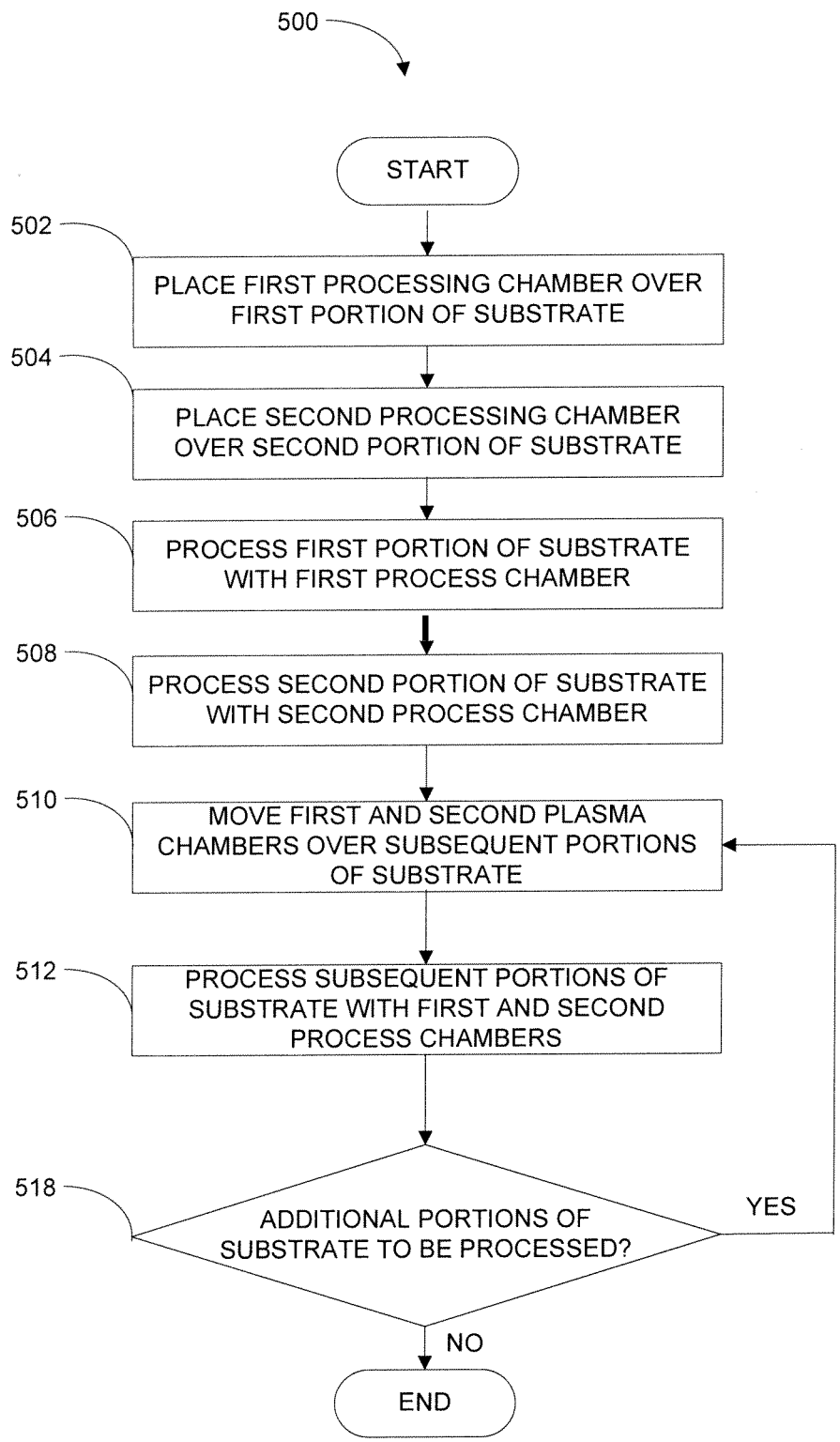
FIG. 5 is a flowchart diagram that illustrates the method operations performed in processing a surface of the substrate with a processing head having multiple processing chambers, in accordance with embodiments of the present invention.

FIG. 5 is a flowchart diagram that illustrates the method operations 500 performed in processing a surface of the substrate 102A with a processing head having multiple processing chambers, in accordance with embodiments of the present invention. The operations illustrated herein are by way of example, as it should be understood that some operations may have sub-operations and in other instances, certain operations described herein may not be included in the illustrated operations. With this in mind, the method and operations 500 will now be described. In an operation 502, a first processing chamber is placed over a first portion of the substrate 102A. In an operation 504, a second processing chamber is placed over a second portion of substrate 102A. Additional processing chambers can be placed over corresponding additional portions of the substrate 102A.

In an operation 506, a first portion of substrate 102A is processed with the first microchamber. In an operation 508, a second portion of substrate 102A is processed with the second microchamber. Additional processing chambers can process corresponding additional portions of the substrate 102A. It should be understood that the first and second portions of the substrate 102A can be processed simultaneously or at different times or for different lengths of time. Further, as described above, the process applied to each of the first and second portions of the substrate 102A can be the same or different.

In an operation 510, the first and second microchambers are moved over subsequent portions of substrate 102A. The first and second microchambers can be moved over subsequent portions of substrate 102A simultaneously or at different times and rates of movement. The first and second microchambers can be moved in the same or different directions. In an operation 512, the subsequent portions of substrate 102A are processed with first and second microchambers.

In an operation 518, if additional portions of the substrate 102A need to be processed then the method operations continue in operation 510 as described above. If no additional portions of the substrate 102A need to be processed then the method operations can end.

IV. Multiple Station Tools

Figure 6A:
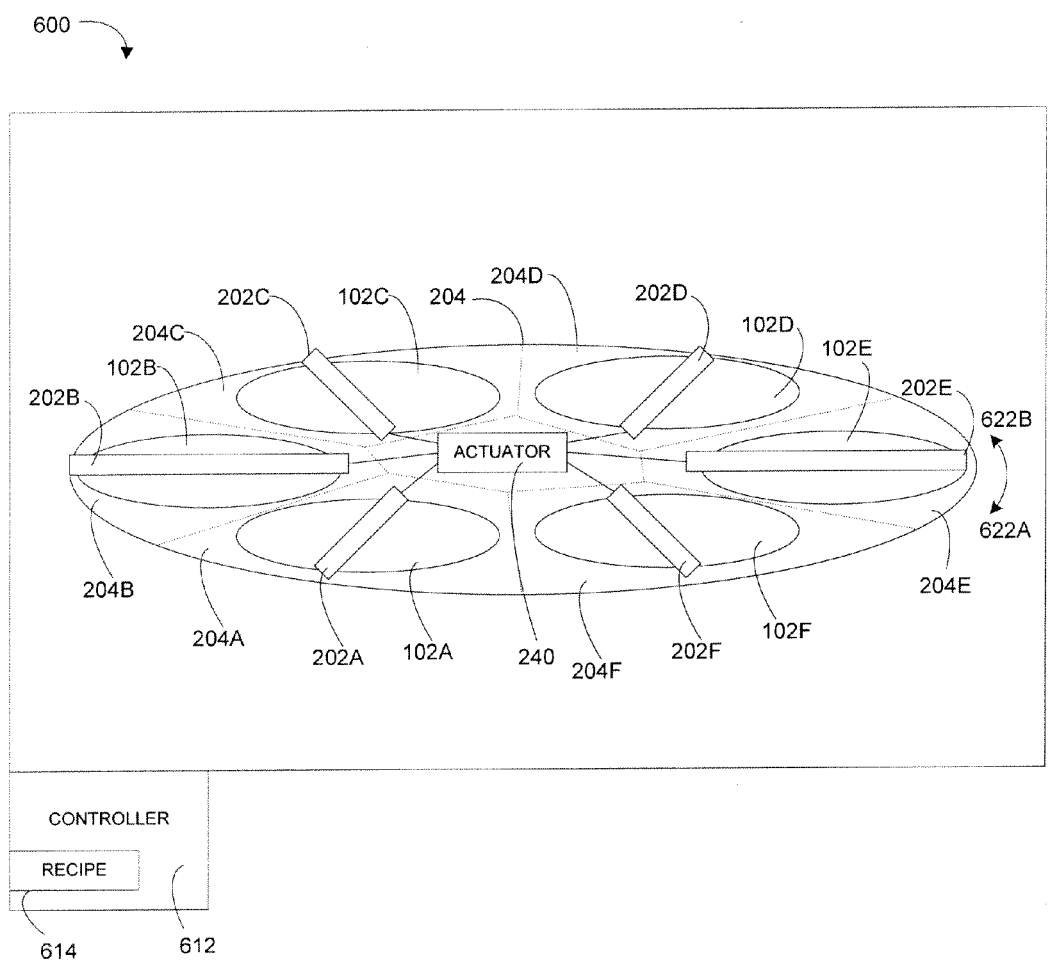
FIGS. 6A-6B show a simplified schematic of multiple station process tools, in accordance with embodiments of the present invention.
Figure 6B:
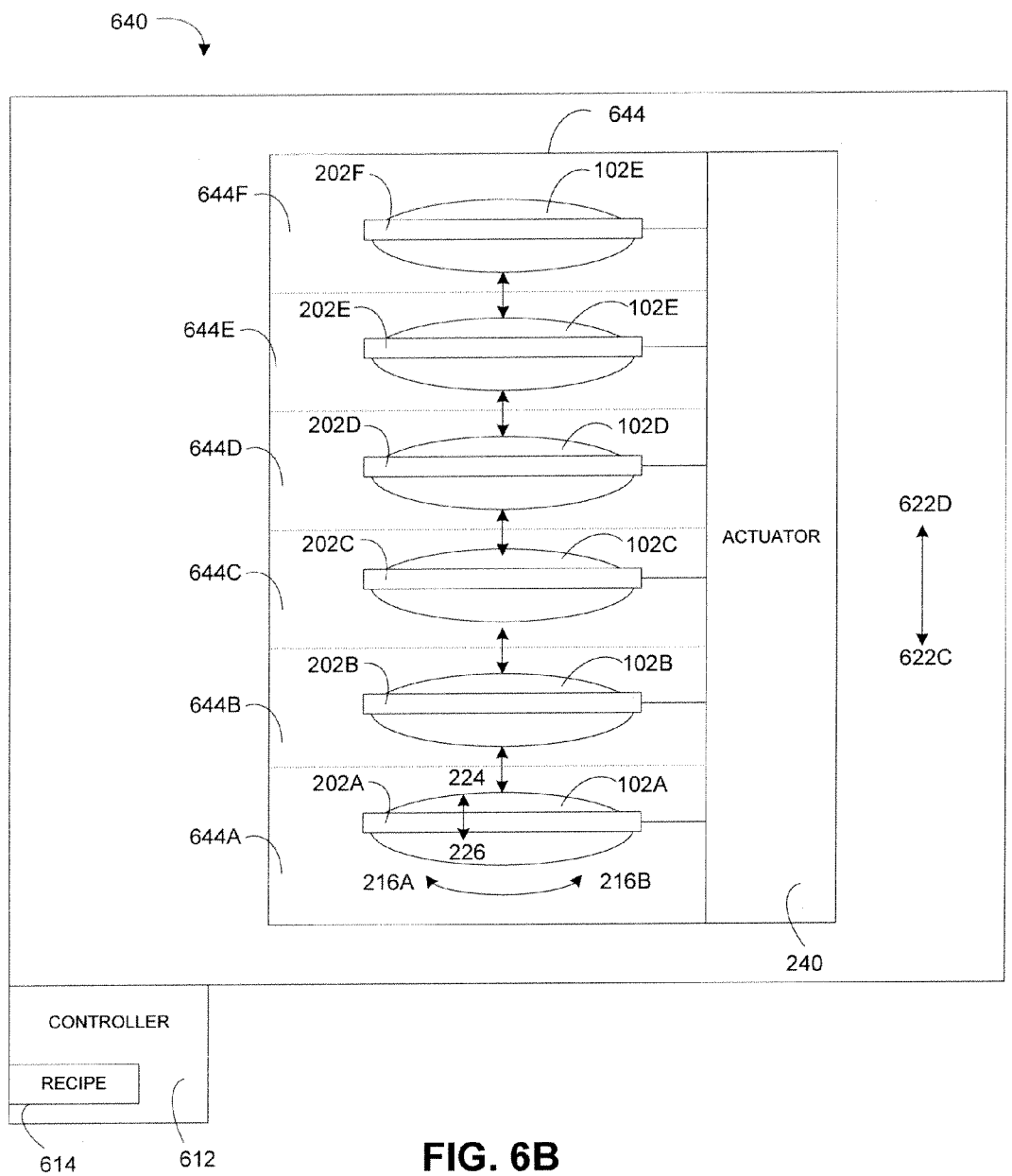

FIGS. 6A-6B show a simplified schematic of multiple station process tools 600, 640, in accordance with embodiments of the present invention. The redundancy of having multiple process heads 204A-204F, 244A-244F in the process tools 600, 540 increases throughput and reliability as the process heads can be processing the substrates 102A-102H in parallel. The multiple process heads 204A-204F, 244A-244F can be any type of processing heads or combinations thereof as described herein.

Referring to FIG. 6A, process tool 600 includes a rotary arrangement of process heads 204A-204F. Each of the process heads 204A-204F includes one or more microchambers 202A-202F. Multiple substrates 102A-102F can be supported and processed by corresponding ones of the process heads 204A-204F. The process heads 204A-204F and/or the substrates 102A-102F can move so that the substrates can be processed by one or more of the process heads. The rotary process tool 600 rotates in directions 622A and 622B. The rotary process tool 600 also includes a controller 612 having a recipe for controlling the operation of the rotary process tool.

Referring to FIG. 6B, process tool 640 includes a linear arrangement of process heads 244A-244F. Each of the process heads 244A-244F includes one or more microchambers 202A-202F. Multiple substrates 102A-102F can be supported and processed by corresponding ones of the process heads 204A-204F. The process heads 244A-244F and/or the substrates 102A-102F can move so that the substrates can be processed by one or more of the process heads. The linear process tool 600 can move the substrates and/or the process heads 244A-244F in directions 622C and 622D. The linear process tool 600 also includes a controller 612 having a recipe for controlling the operation of the linear process tool. The substrates 102A-102F can also rotate about their axis at each one of the process heads 204A-204F, 244A-244F.

As described above, it should be understood that the process heads 204A-204F, 244A-244F and/or the substrates 102A-102F can move in the same or different directions and at different rates of movement. Actuator 240 can be a stepper motor, a pneumatic actuator, a hydraulic actuator, an electromechanical actuator, a piezoelectric actuator for fine movement and or vibrating or any other suitable types of actuators.

Each of the processing heads 204A-204F, 244A-244F can be applying the same or different process to the substrates 102A-102H. Similar to as was described above with regard to multiple processing chambers in a single processing head, each processing head 204A-204F, 244A-244F can apply a respective process. By way of example, a first processing head 204A, 244A can apply a plasma etch process to the substrate 102A. Then the substrate 102A is moved to process head 204B, 244B where a finish plasma etch process is applied. Then the substrate 102A is moved to process head 204C, 244C where a proximity head cleaning is performed. One or more of the processing heads 204A-204F, 244A-244F can apply a pre-cleaning process such as cleaning the backside of substrate 102A-102H to make sure the chuck properly contacts the substrate.

As the processing heads 204A-204F, 244A-244F and substrates 102A-102H can both be movable, then residence time for each substrate at each processing head can vary. By way of example, processing head 204A moves 12" per minute and the substrate is stationary. As a result, the relative speed is 12"/min. Processing head 204B also moves 12" per minute in a first direction and the substrate 102B moves 12" per minute in a second, opposite direction, resulting in a relative speed of 24" per minute. Similarly, processing head 204C moves in the first direction at 11"/min and the substrate 102B moves in the same first direction at 12"/min, yielding a relative speed of 1"/min. This type of different speed could be usable because in Processing head 204A and processing head 204B the user desires a multiple rapid passes so that the substrate 102A is etched in many thin layers so that the relative processing time at station 1, 2 and 3 is approximately equal.

Figure 7:
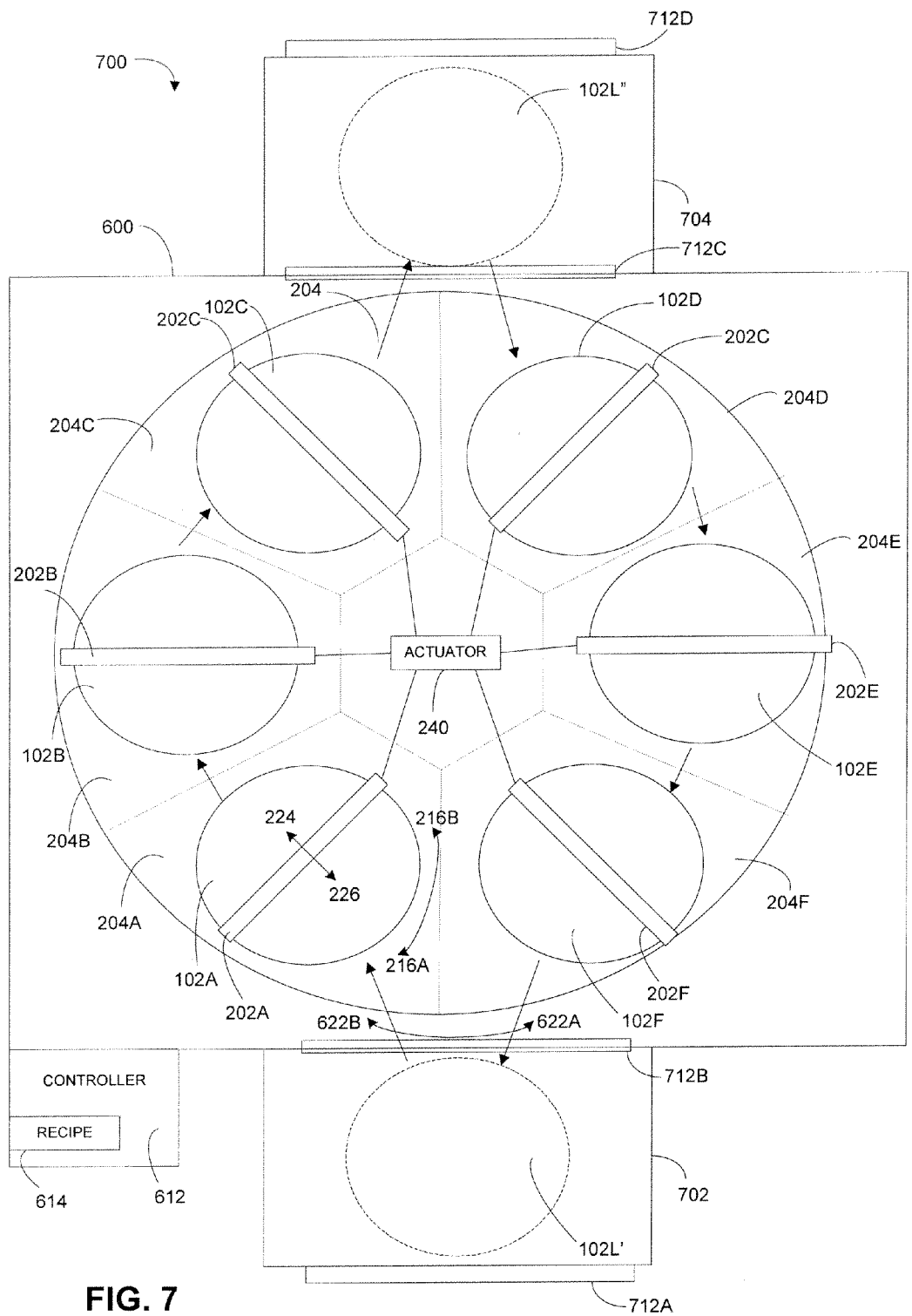
FIG. 7 shows a simplified schematic of a process tool, in accordance with embodiments of the present invention.

FIG. 7 shows a simplified schematic of a process tool 700, in accordance with embodiments of the present invention. The process tool 700 includes the rotary process tool 600, as shown, or a linear process tool 640, not shown. The process tool 700 also includes loading/unloading ports 702, 704. The loading/unloading ports 702, 704 include load locks 712A-712D.

Figure 8:
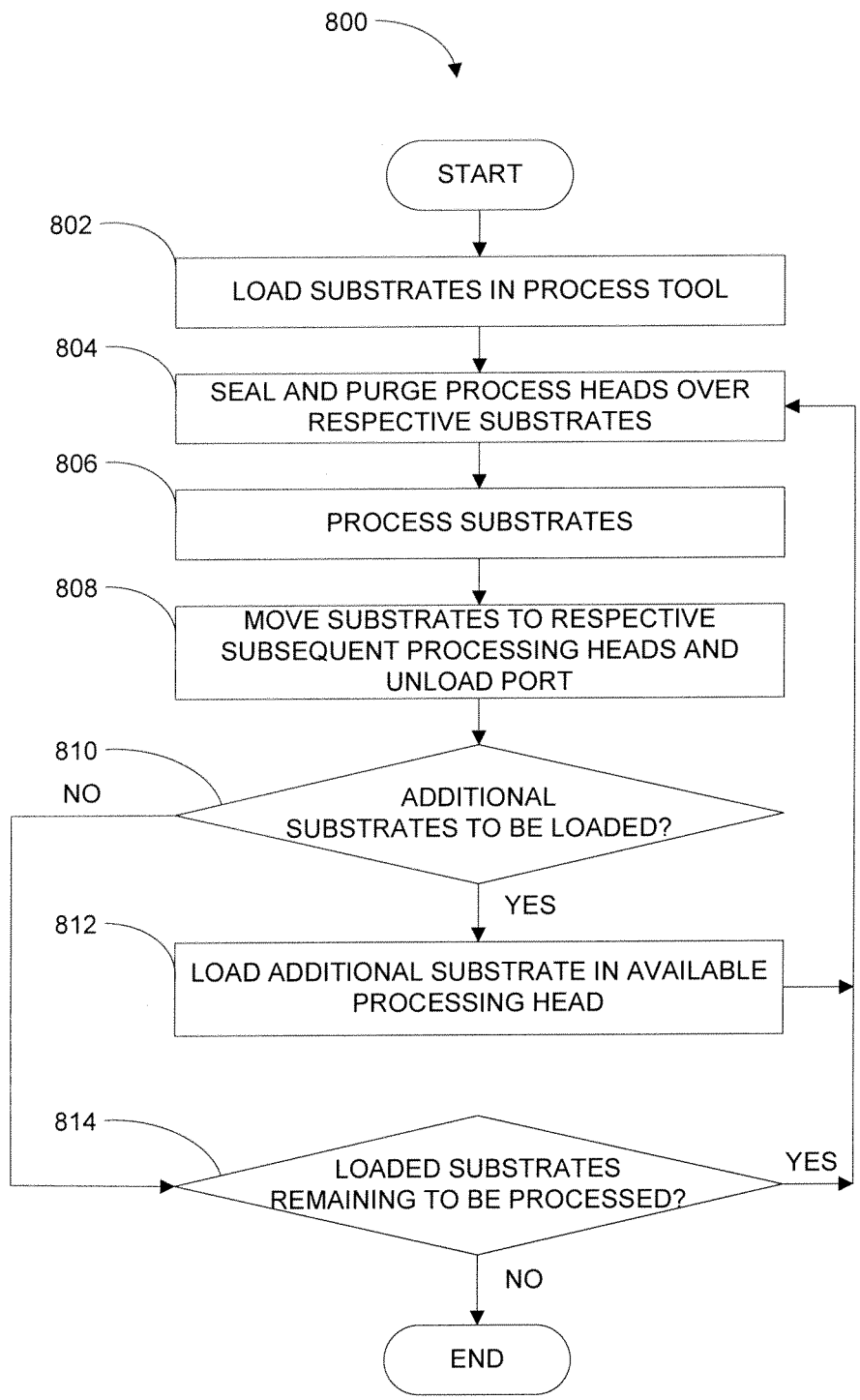
FIG. 8 is a flowchart diagram that illustrates the method operations performed in processing substrates with a multiple processing head process tool, in accordance with embodiments of the present invention.

FIG. 8 is a flowchart diagram that illustrates the method operations 800 performed in processing substrates 102A-102F with a multiple processing head process tool 700, in accordance with embodiments of the present invention. The operations illustrated herein are by way of example, as it should be understood that some operations may have sub-operations and in other instances, certain operations described herein may not be included in the illustrated operations. With this in mind, the method and operations 800 will now be described. In an operation 802, substrates 102A-102F are loaded into the multiple processing head process tool 700 through the loading/unloading ports 702, 704. All of the substrates 102A-102F can be loaded before processing begins. Alternatively, the substrates 102A-102F can be loaded sequentially as the substrates are processed through the process heads 204A-204F, 244A-244F. The substrates 102A-102F can be loaded sequentially or in batches. By way of example, one or more substrates 102A-102F can be loaded through each of the loading/unloading ports 702, 704.

In an operation 804, the processing heads 204A-204F and 244A-244F are sealed over the substrates 102A-102F and purged for preparation for processing. In an operation 806, the substrates 102A-102F are processed by the respective processing heads 204A-204F. It should be understood that the processing heads 204A-204F and 244A-244F can process the respective substrates 102A-102F for the same or different time intervals as described elsewhere herein. The respective substrates 102A-102F can be process in parallel to provide improved throughput.

In an operation 808, the substrates 102A-102F are sequentially moved through the respective, subsequent processing heads 204A-204F and 244A-244F or the unload port 702, 704. By way of example, substrate 102A is progressed to processing head 204B and substrate 102B is progressed to processing head 204C and substrate 102C is progressed to processing head 204D and substrate 102D is progressed to processing head 204E and substrate 102E is progressed to processing head 204F. As substrate 102F has progressed through all of the processing heads 204A-204F then processing of substrate 102F complete and substrate 102F is therefore progressed to the load/unload port 702, 704. As a result processing head 204A is left without a substrate.

In an operation 810 an inquiry is made to determine if there are additional substrates (e.g., substrate 102L') is available to be loaded. If substrate 102L' is available to be loaded, then in operation 812, substrate 102L is loaded in head 204A and the method operations continue in operation 804 as described above.

If, in operation 810 there are no additional substrates available to be loaded then the method operations continue in operation 814. If there are previously loaded substrates remaining to be processed, then the method operations continue in operation 804 as described above. If there are previously loaded substrates remaining to be processed, then the method operations can end.

V. Multiple Station Tools Integrated in a Manufacturing Facility

Figure 9A:
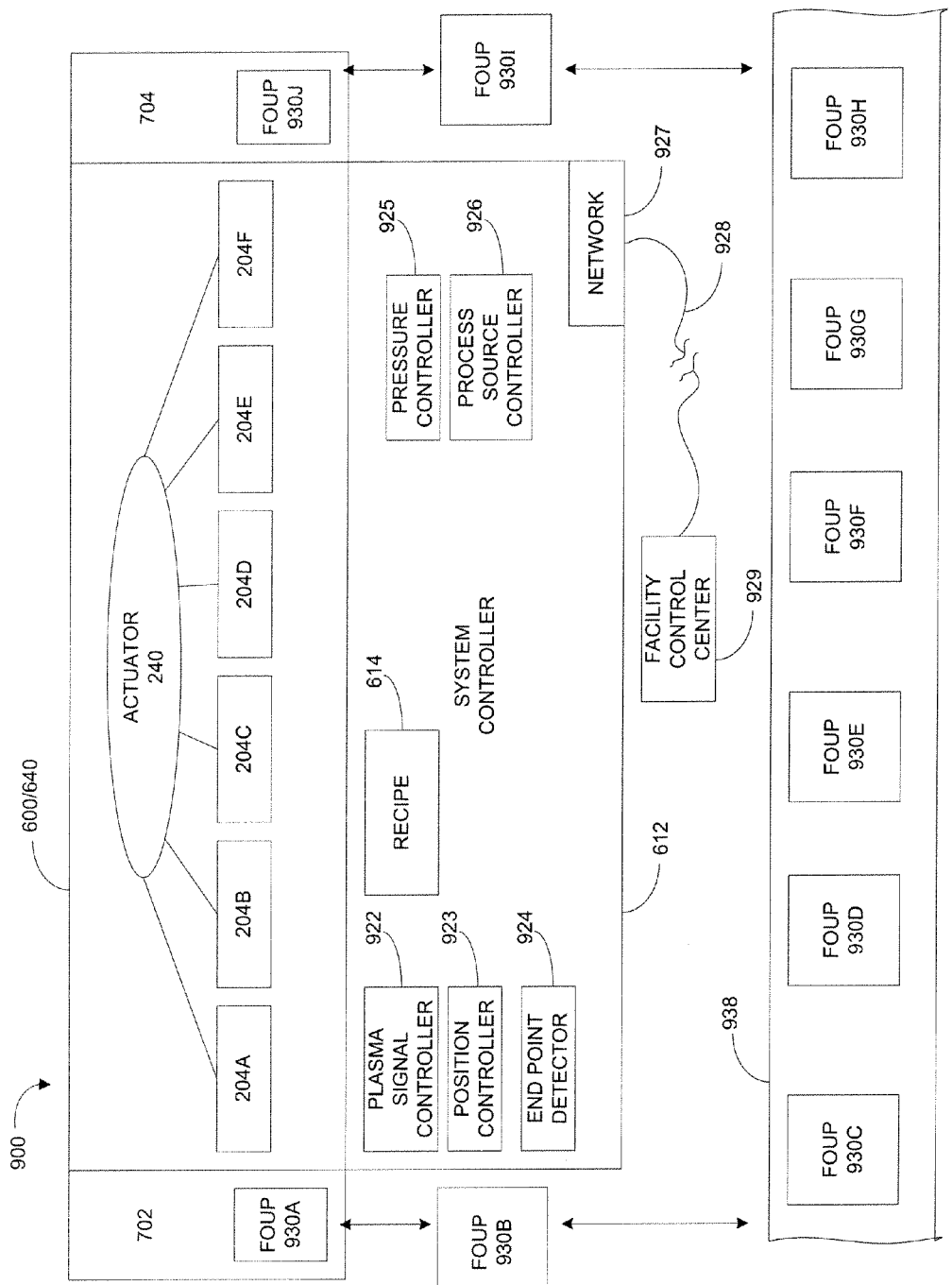
FIG. 9A shows multiple processing head process tools in a manufacturing system, in accordance with embodiments of the present invention.

FIG. 9A shows multiple processing head process tools 600, 640 in a manufacturing system 900, in accordance with embodiments of the present invention. The manufacturing system 900 includes a front opening unified pod (FOUP) transport system 938 for handling and transporting FOUPs 930A-930J. The load/unload ports 702, 704 of the multiple processing head process tools 600, 640 can accommodate a FOUP for handling and transporting the substrates.

The controller 612 includes control subsystems for controlling the plasma signal 922, for controlling the actuator position 923, for detecting the end points of the various processing 924, pressures and vacuum 925, process source controls 926 and the process recipe 614. Each of the control subsystems are linked to the respective hardware portions necessary for executing the control. By way of example, the position controller 923 is linked to the actuators and other movable portions of the multiple processing head process tools 600, 640. The controller 612 also includes some suitable type of network interface 927 that provides a wired or wireless link 928 to a facility network 929.

FIG. 9B shows multiple processing head process tools 600, 640 in a manufacturing facility 950, in accordance with embodiments of the present invention. The multiple processing head process tools 600, 640 and other process tools 952 are coupled by a network 927 to the facility control center 929. The facility control center 929 includes a central controller 940 to provide a centralized access to the controllers 612 of each of the multiple processing head process tools 600, 640.

Figure 10:
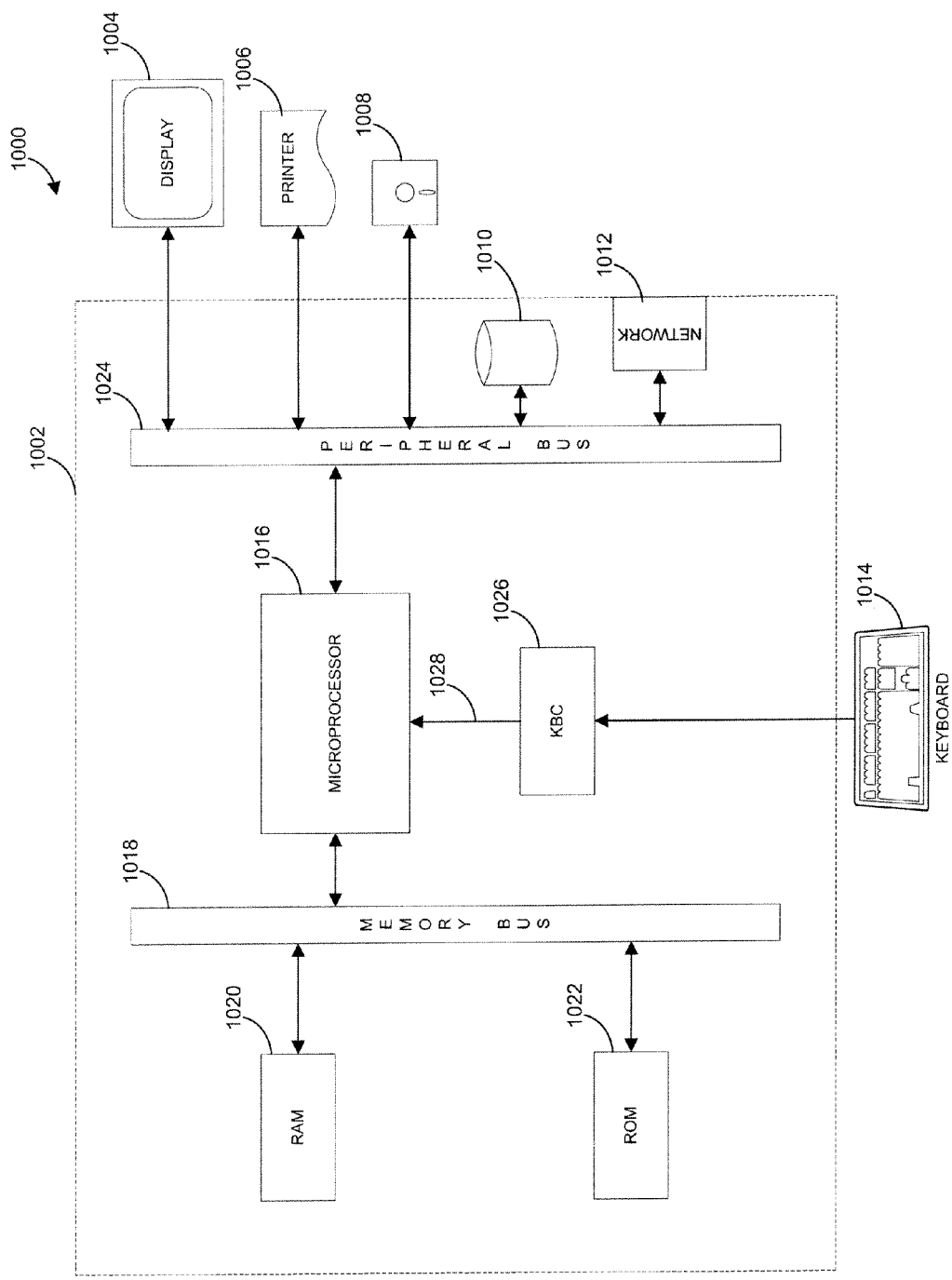
FIG. 10 is a block diagram of an exemplary computer system for carrying out the processing, in accordance with embodiments of the present invention.

FIG. 10 is a block diagram of an exemplary computer system 1000 for carrying out the processing, in accordance with embodiments of the present invention (e.g., the controller 612 and or the facility controller 940, described above). The computer system 1000 includes a digital computer 1002, a display screen (or monitor) 1004, a printer 1006, a floppy disk drive 1008, a hard disk drive 1010, a network interface 1012, and a keyboard 1014. The computer 1002 includes a microprocessor 1016, a memory bus 1018, random access memory (RAM) 1020, read only memory (ROM) 1022, a peripheral bus 1024, and a keyboard controller (KBC) 1026. The computer 1002 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 1016 is a general purpose digital processor, which controls the operation of the computer system 1000. The microprocessor 1016 can be a single-chip processor or can be implemented with multiple components. Using instructions retrieved from memory, the microprocessor 1016 controls the reception and manipulation of input data and the output and display of data on output devices.

The memory bus 1018 is used by the microprocessor 1016 to access the RAM 1020 and the ROM 1022. The RAM 1020 is used by the microprocessor 1016 as a general storage area and as scratch-pad memory, and can also be used to store input data and processed data. The ROM 1022 can be used to store instructions or program code followed by the microprocessor 1016 as well as other data.

The peripheral bus 1024 is used to access the input, output, and storage devices used by the digital computer 1002. In the described embodiment, these devices include the display screen 1004, the printer device 1006, the floppy disk drive 1008, the hard disk drive 1010, and the network interface 1012. The keyboard controller 1026 is used to receive input from keyboard 1014 and send decoded symbols for each pressed key to microprocessor 1016 over bus 1028.

The display screen 1004 is an output device that displays images of data provided by the microprocessor 1016 via the peripheral bus 1024 or provided by other components in the computer system 1000. The printer device 1006, when operating as a printer, provides an image on a sheet of paper or a similar surface. Other output devices such as a plotter, typesetter, etc. can be used in place of, or in addition to, the printer device 1006.

The floppy disk drive 1008 and the hard disk drive 1010 can be used to store various types of data. The floppy disk drive 1008 facilitates transporting such data to other computer systems, and hard disk drive 1010 permits fast access to large amounts of stored data.

The microprocessor 1016 together with an operating system operate to execute computer code and produce and use data. The computer code and data may reside on the RAM 1020, the ROM 1022, or the hard disk drive 1010. The computer code and data could also reside on a removable program medium and loaded or installed onto the computer system 1000 when needed. Removable program media include, for example, CD-ROM, PC-CARD, floppy disk, flash memory, optical media and magnetic tape.

The network interface 1012 is used to send and receive data over a network connected to other computer systems. An interface card or similar device and appropriate software implemented by the microprocessor 1016 can be used to connect the computer system 1000 to an existing network and transfer data according to standard protocols.

The keyboard 1014 is used by a user to input commands and other instructions to the computer system 1000. Other types of user input devices can also be used in conjunction with the present invention. For example, pointing devices such as a computer mouse, a track ball, a stylus, or a tablet can be used to manipulate a pointer on a screen of a general-purpose computer.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the figures can also be implemented in software stored in any one of or combinations of the RAM, the ROM, or the hard disk drive.

VI. Dynamic Chuck

Figure 11A:
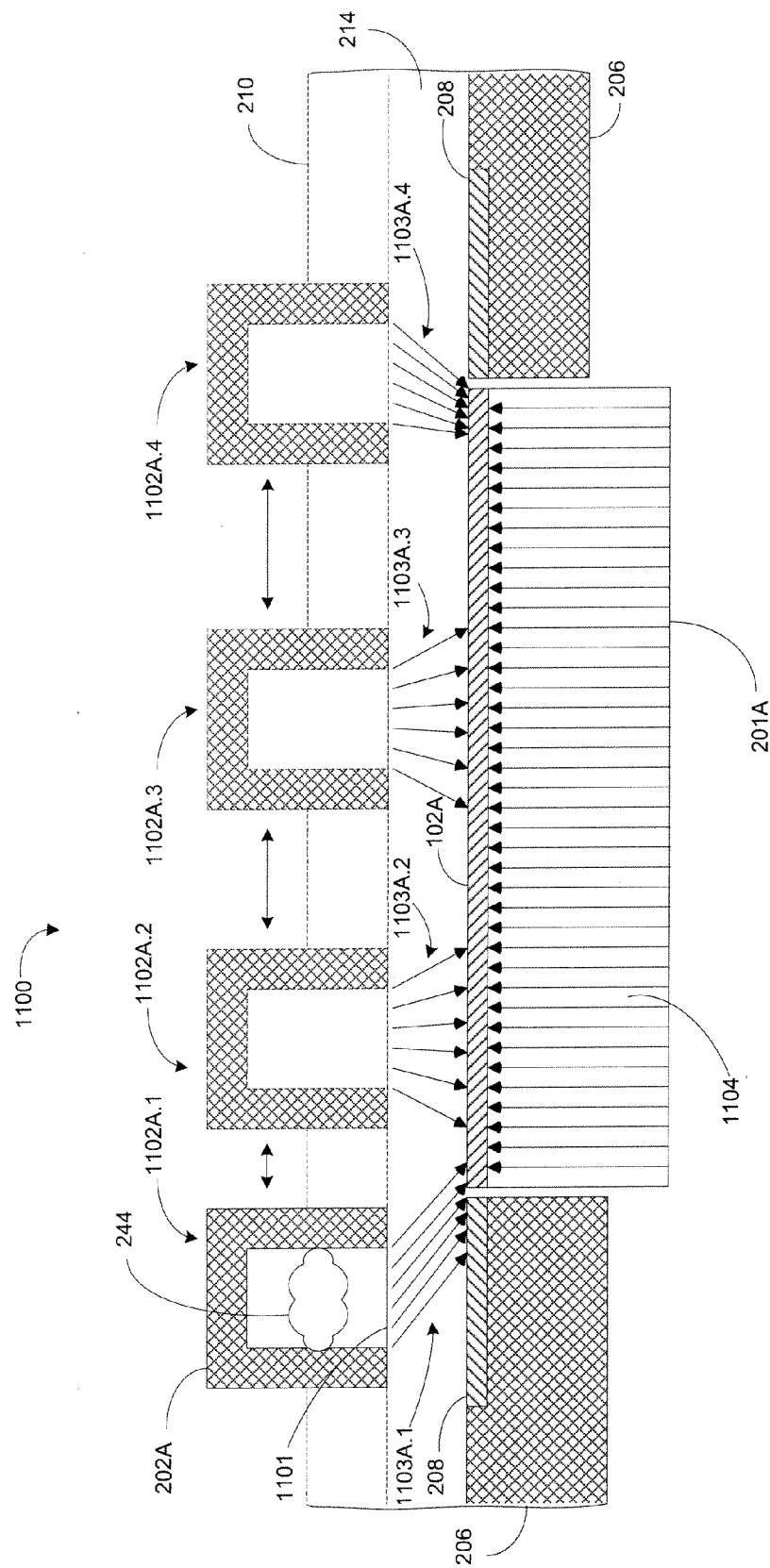
FIG. 11A shows a schematic diagram of a processing head, in accordance with embodiments of the present invention.

FIG. 11A shows a schematic diagram of a processing head 1100, in accordance with embodiments of the presenting invention. The processing head 1100 includes a single microchamber 202A shown in four positions 1102A.1-1102A.4 relative to the substrate 102A. The chuck 201A is supporting the substrate 102A. The biasing source 232B provides a bias power at the desired frequency (bias signal 1104) to the chuck 201A. The bias signal 1104 is applied to the substrate 102A though contact between the substrate and surface of the chuck 201A. The microchamber 202A emits the electromagnetic energy 1103A from the plasma 244 from the open side 1101 of the microchamber (e.g., toward the substrate 102A and/or toward the edge ring 208).

In position 1102A1, the electromagnetic energy 1103A is directed somewhat toward the edge ring 208 however, as the current path leads through the substrate 102A to the chuck 201A, then at least some of the current is pulled toward the edge of the substrate 102A. This current also pulls the ions toward the edge of the substrate 102A. As a result the edge and the region adjacent to the edge of the substrate can gain additional processing time and residence time as compared to other portions of the substrate 102A.

As the microchamber 202A is moved from position 1102A.1 to position 1102A.2, the current path 1103A.2 leads substantially straight through the substrate 102A to the chuck 201A. Similarly, as the microchamber 202A is moved from position 1102A.2 to position 1102A.3, the current path 1103A.3 leads substantially straight through the substrate 102A to the chuck 201A.

Figure 11B:
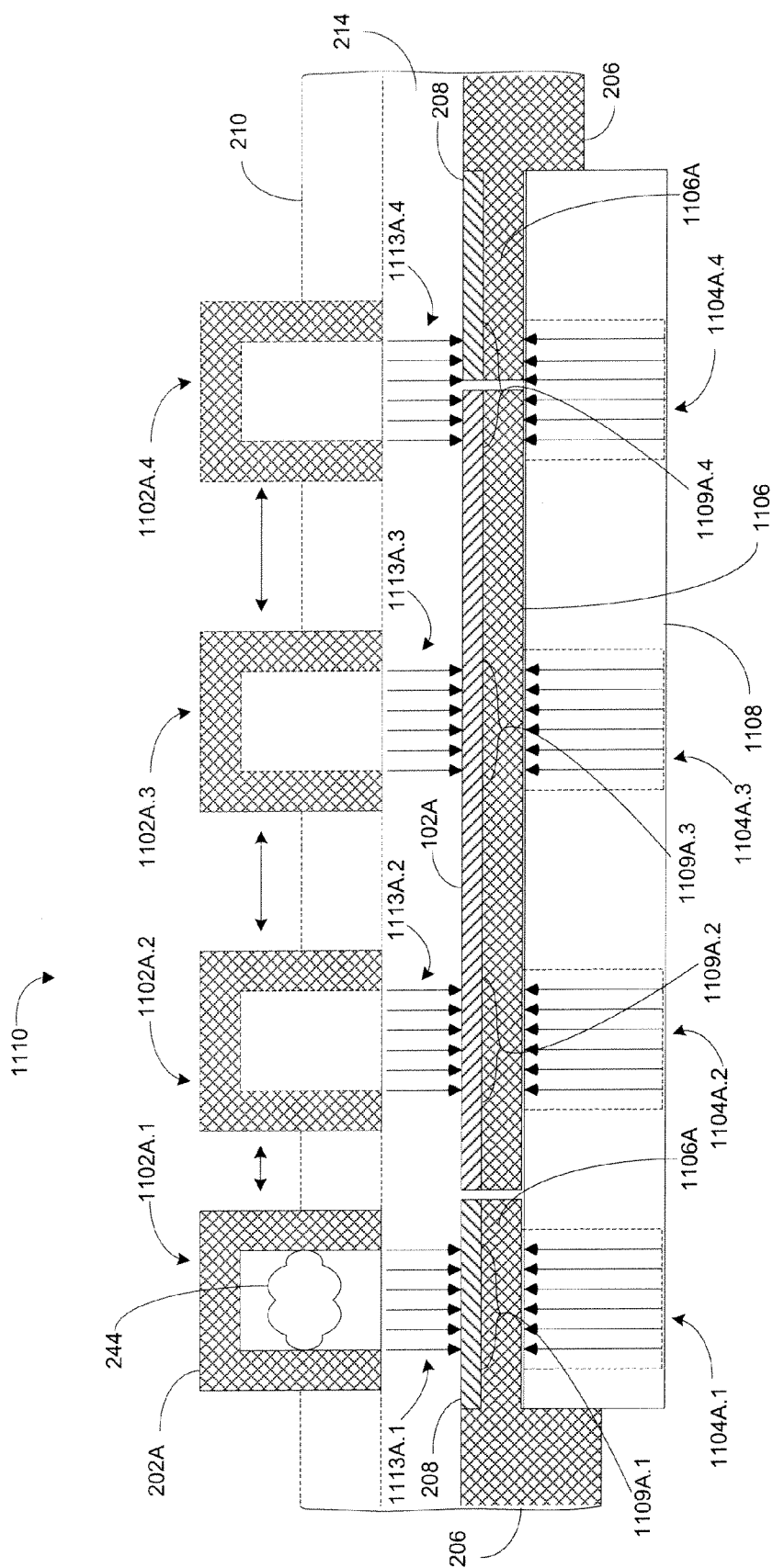
FIG. 11B shows a schematic diagram of a processing head, in accordance with embodiments of the present invention.

As the microchamber 202A is moved from position 1102A.3 to position 1102A.4, the current path 1103A.4 leads substantially straight through the substrate 102A to the chuck 201A but possibly not as uniformly toward the edge ring 208. This current can also pull some of the ions toward the edge of the substrate 102A. As a result the edge and the region adjacent to the edge of the substrate can gain additional processing time and residence time as compared to other portions of the substrate 102A FIG. 11B shows a schematic diagram of a processing head 1110, in accordance with embodiments of the present invention. The processing head 1110 includes a dynamic chuck 1108. The dynamic chuck 1108 provides the support and the biasing to the opposite side of the substrate 102A and to the edge ring 208. A relatively thin layer of support material 1106 is provided between the chuck 201A and the substrate 102A. A relatively thin layer of support material 1106A is provided and between the chuck 201A and the edge ring 208. The support material 1106, 1106A can be one piece. Alternatively, the support material 1106, 1106A can be separate.

The chuck 1108 reduces the concentrating of the ions at the edges of the substrate 102A as described above. The dynamic chuck 1108 can further reduce concentration of the ions at the edges of the substrate 102A and also gain electrical efficiencies. As the microchamber 202A only needs the corresponding portion of the edge ring 208 and/or the substrate 102A to be biased.

Figure 11C:
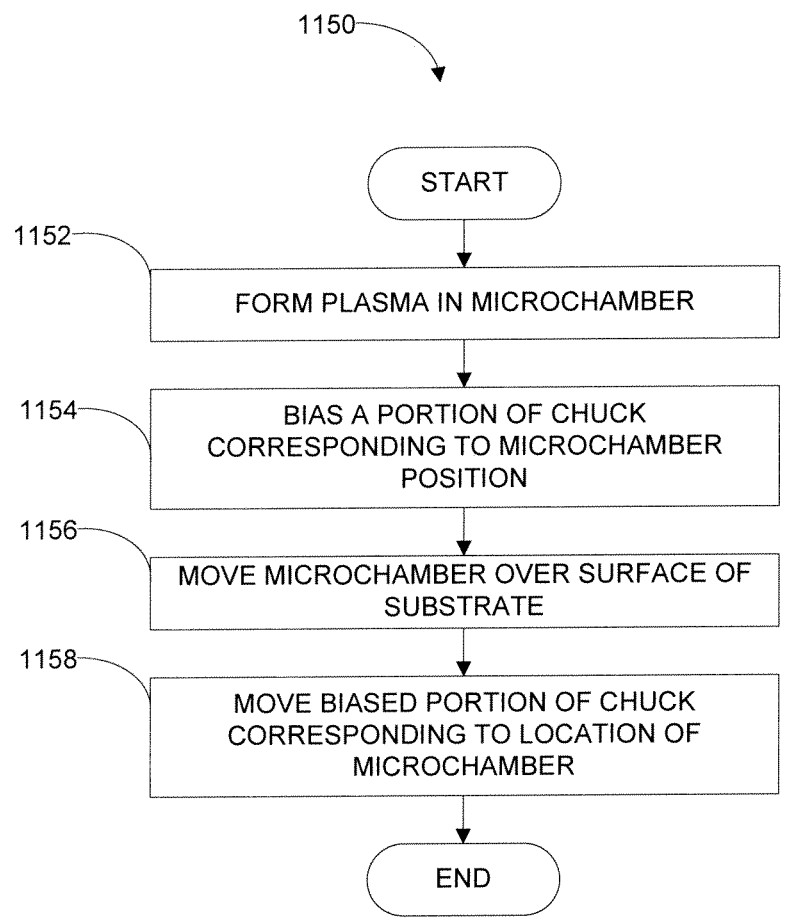
FIG. 11C is a flowchart diagram that illustrates the method operations performed in forming a plasma in the microchamber 202A and moving the microchamber and biasing corresponding portions of the dynamic chuck, in accordance with one embodiment of the present invention.

FIG. 11C is a flowchart diagram that illustrates the method operations 1150 performed in forming a plasma in the microchamber 202A and moving the microchamber and biasing corresponding portions of the dynamic chuck 1108, in accordance with one embodiment of the present invention. The operations illustrated herein are by way of example, as it should be understood that some operations may have sub-operations and in other instances, certain operations described herein may not be included in the illustrated operations. With this in mind, the method and operations 1150 will now be described. In an operation 1152 a plasma is formed in the microchamber 202A in position 1102A.1. In an operation 1154, the dynamic chuck 1108 need only bias corresponding portion 1104A.1 of the dynamic chuck so that the corresponding portion 1109A.1 of the edge ring 208 is biased. As a result the current path and ion path is substantially restricted to only the corresponding portion 1109A.1 of the edge ring 208 between the microchamber 202A and the corresponding portion 1104A.1 of the dynamic chuck 1108.

In an operation 1156, the microchamber is moved to a subsequent position 1102A.2. In an operation 1158, the dynamic chuck 1108 need only bias corresponding portion 1104A.2 of the dynamic chuck so that the corresponding portion 1109A.2 of the substrate 102A is biased. As a result the current path and ion path is substantially restricted to only the corresponding portion 1109A.2 of the substrate 102A between the microchamber 202A and the corresponding portion 1104A.2 of the dynamic chuck 1108.

The method operations continue in operations 1156 and 1158 for subsequent portions of the substrate and/or edge ring 208 and the method operations can end. For example, as the microchamber is moved to position 1102A.3, the dynamic chuck 1108 need only bias corresponding portion 1104A.3 of the dynamic chuck so that the corresponding portion 1109A.3 of the substrate 102A is biased. As a result the current path and ion path is substantially restricted to only the corresponding portion 1109A.3 of the substrate 102A between the microchamber 202A and the corresponding portion 1104A.3 of the dynamic chuck 1108.

As the microchamber is moved to position 1102A.4, the dynamic chuck 1108 need only bias corresponding portion 1104A.4 of the dynamic chuck so that the corresponding portion 1109A.4 of the substrate 102A and the edge ring 208 is biased. As a result the current path and ion path is substantially restricted to only the corresponding portion 1109A.4 of the substrate 102A between the microchamber 202A and the corresponding portion 1104A.4 of the dynamic chuck 1108.

Biasing only the corresponding portions of the dynamic chuck 1106 reduces the energy requirements of biasing and also provides a more controlled flow of the ions from the plasma to the substrate. The dynamic chuck 1106 can include a many electrically separate portions that can be selectively biased so that only those areas of the substrate 102A that require biasing at any given time can be selectively biased. The many electrically separate portions that can be selectively biased via a matrix similar to a well known memory matrix type systems. Other systems such as addressable electrically separate portions of the dynamic chuck 1106 can be implemented.

Figure 11D:
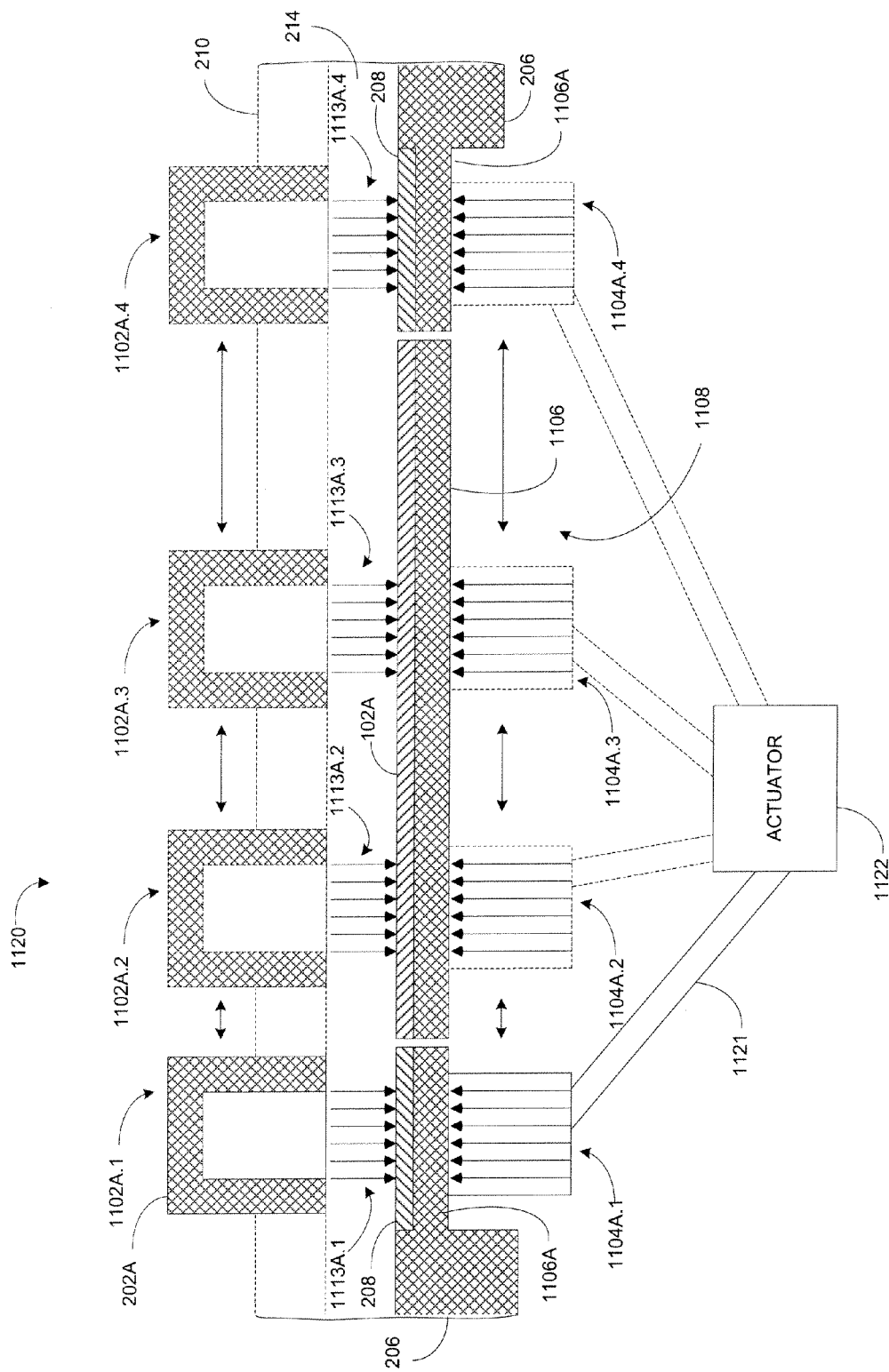
FIG. 11D shows a schematic diagram of a processing head, in accordance with embodiments of the present invention.

FIG. 11D shows a schematic diagram of a processing head 1120, in accordance with embodiments of the presenting invention. The dynamic chuck 1108 includes a movable portion 1124 of the dynamic chuck that can be moved corresponding locations (e.g., 1104A.1-1104A.4, etc.) to the location (e.g., locations 1102A.1-1102A.4, etc.) of the microchamber 202A. An actuator 1122 is coupled to the movable portion 1124 by link 1121. The actuator 1122 moves the movable portion 1124 as needed. The movable portion 1124 of the dynamic chuck can be the only portion of the dynamic chuck that is biased and thus the biased movable portion can be moved to correspond to microchamber location and the remaining portion of the substrate support 1106 and edge ring support 1106A are not biased unless aligned with the microchamber 202A.

While the processing head 1100, 1120 is described above with only one microchamber 202A, it should be understood that the processing head 1100, 1120 can include multiple microchambers as described herein. Correspondingly, dynamic chuck 1108 can have multiple movable portions 1104A and/or the multiple portions that can be selectively biased that can be substantially aligned and correspond with each one of the multiple microchambers 202A in the processing head 1100, 1120.

Figure 12A:
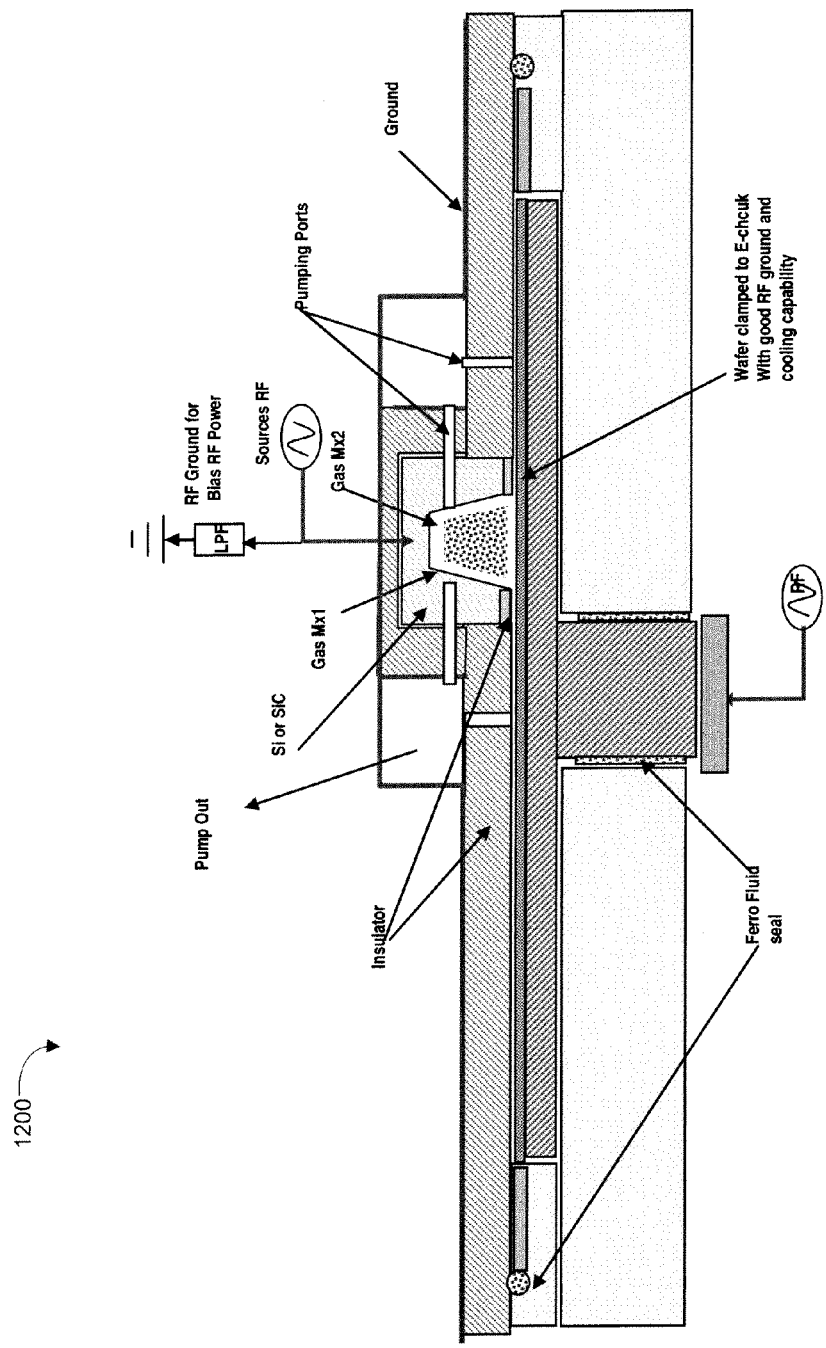
FIGS. 12A-12C are plasma microchambers, in accordance with embodiments of the present invention.
Figure 12B:
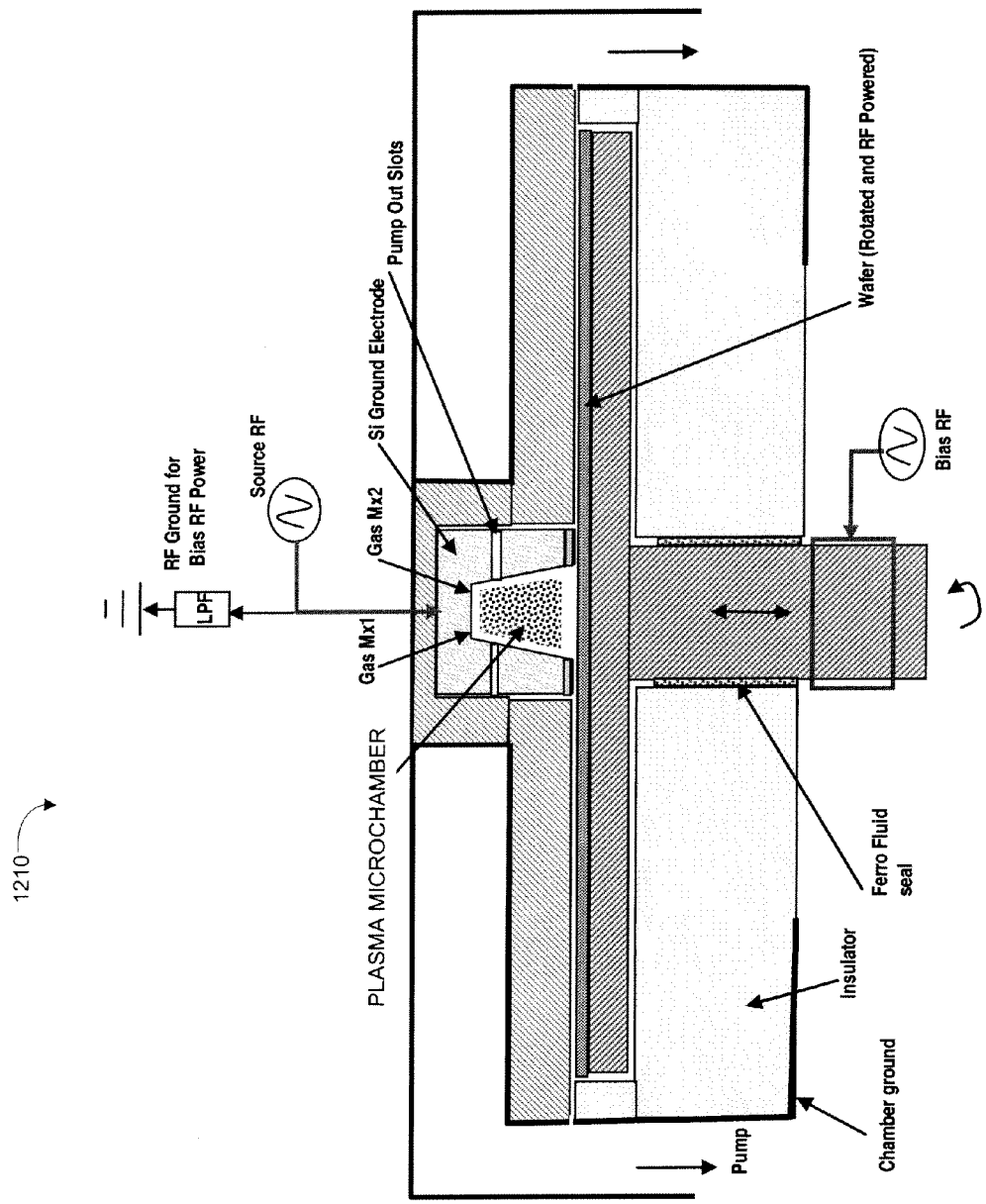
Figure 12C:
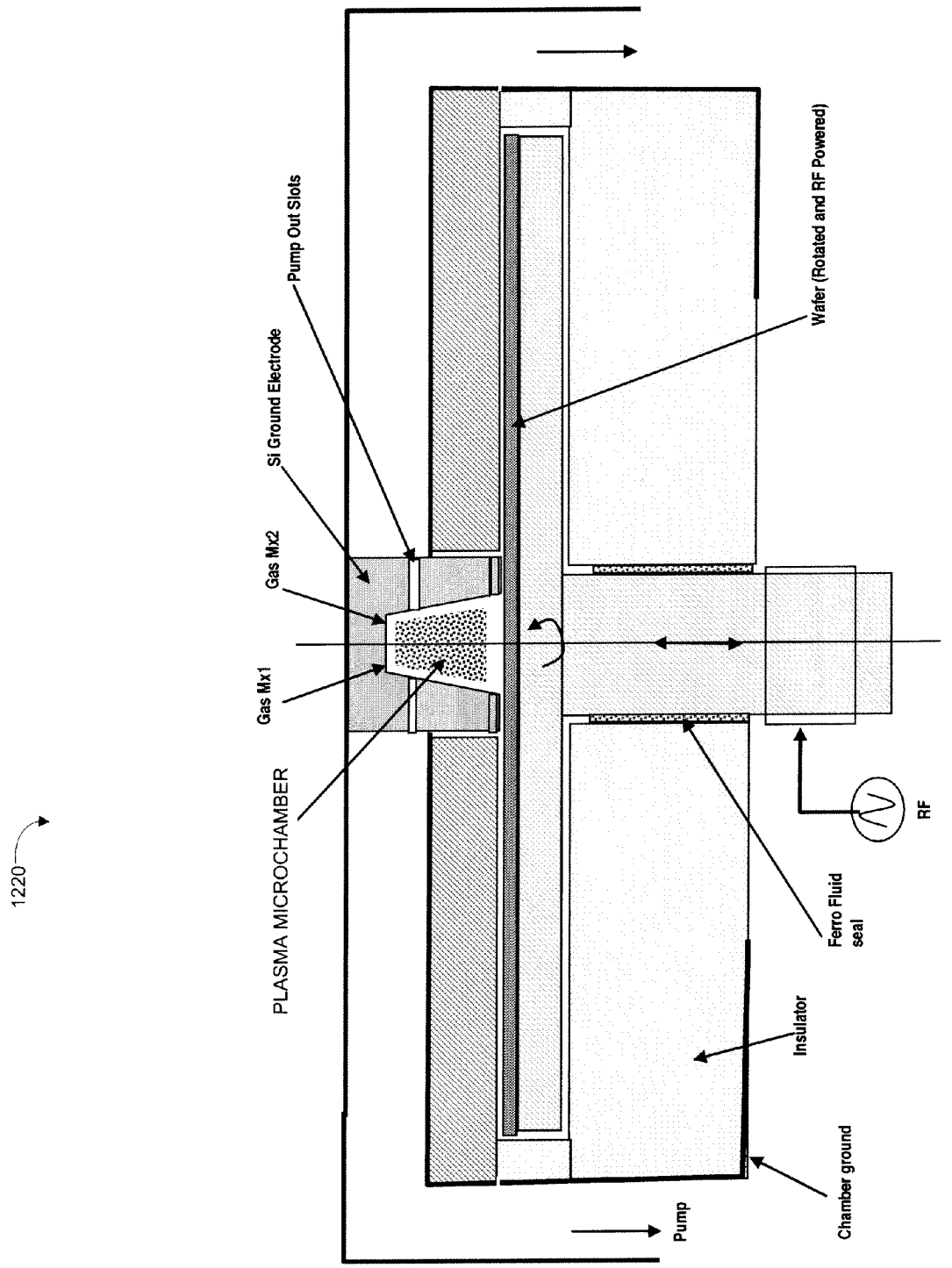
Figure 12D:
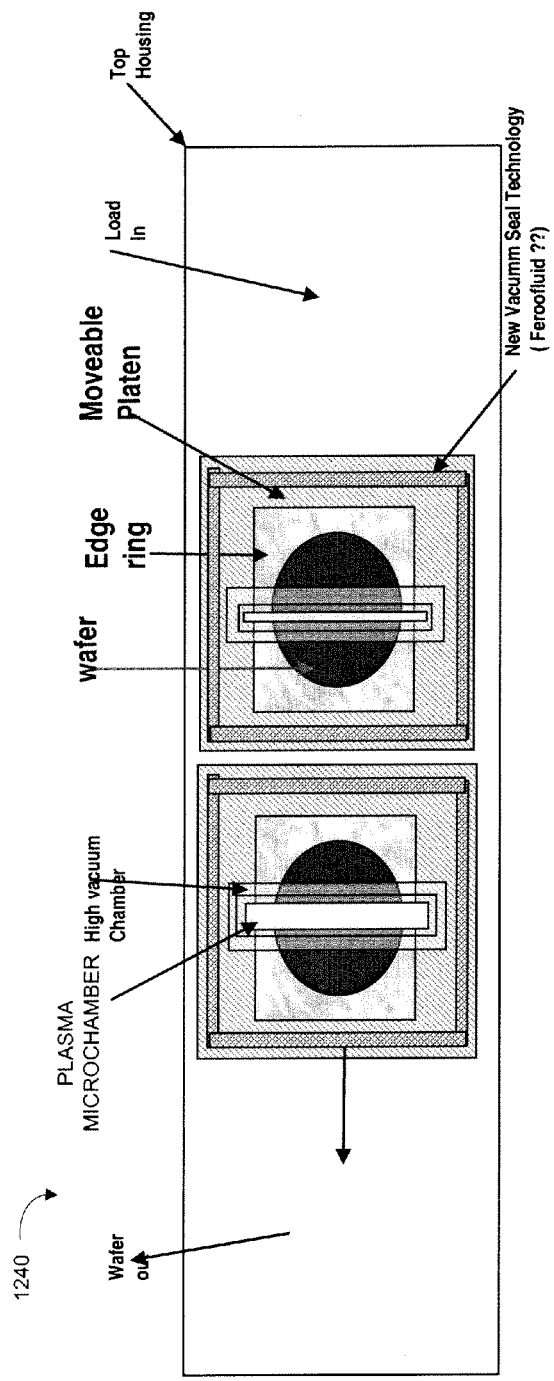
FIG. 12D is a top view of a linear multiple microchamber system, in accordance with embodiments of the present invention.
Figure 12E:
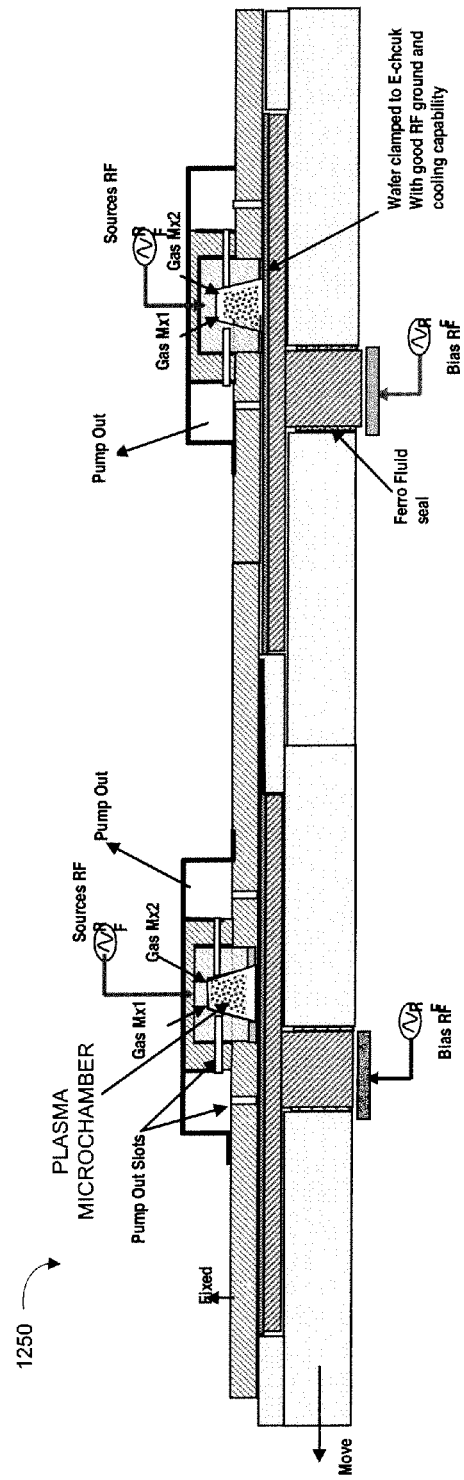
FIG. 12E is a side view of a linear multiple microchamber system, in accordance with embodiments of the present invention.
Figure 12F:
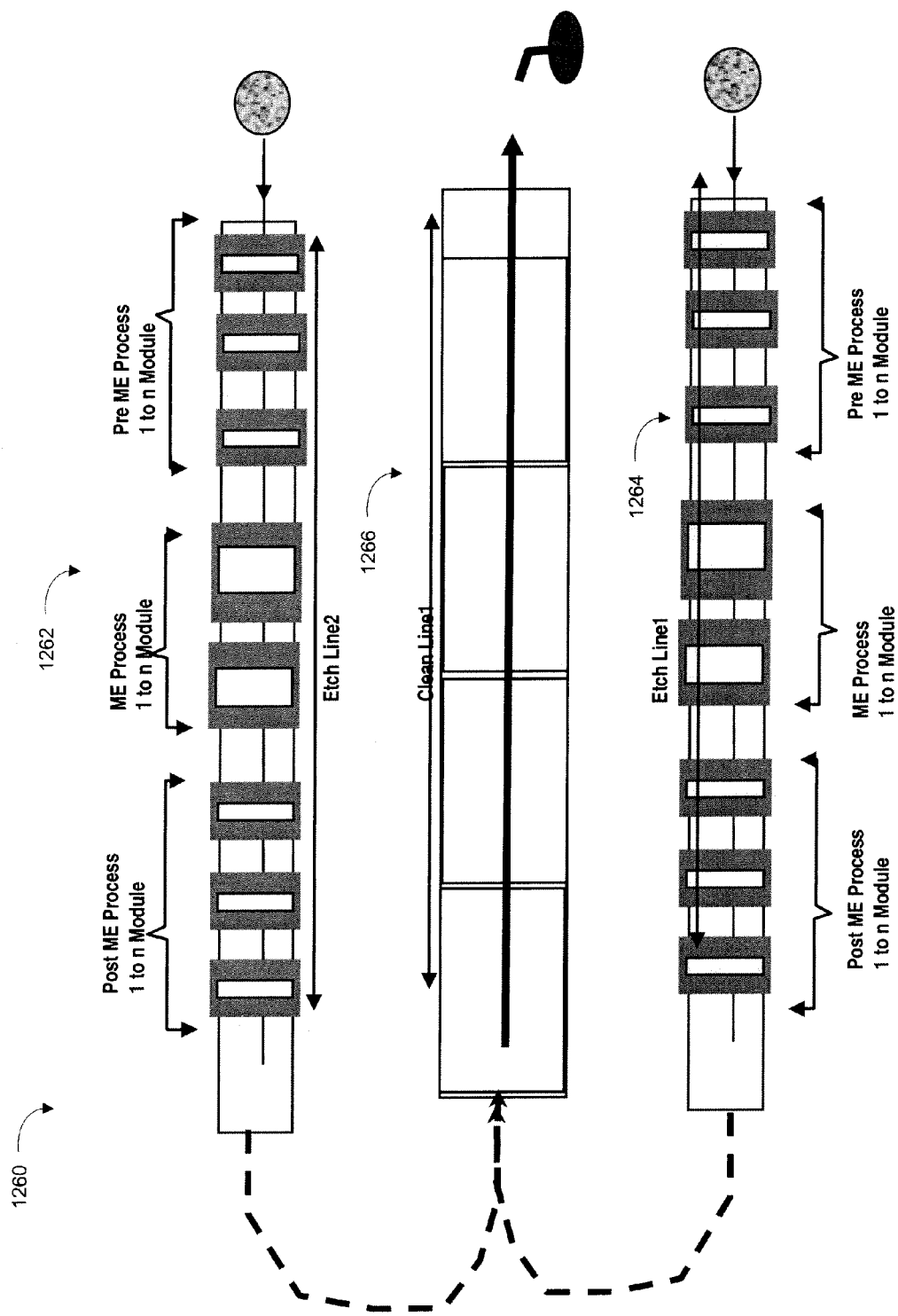
FIG. 12F is a top view of a system including two, linear multiple microchamber systems feeding substrates to a cleaning line, in accordance with embodiments of the present invention.
Figure 12G:
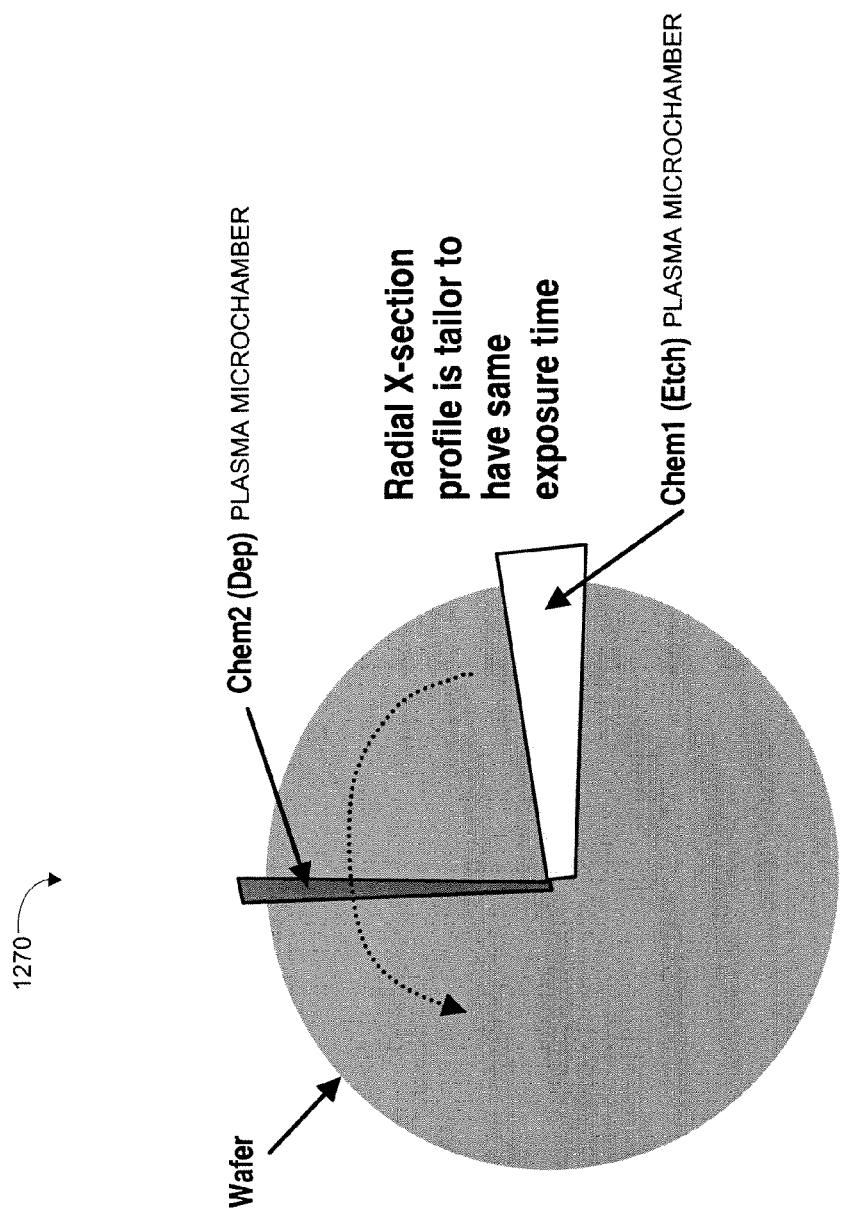
FIG. 12G is a top view of a system with two multiple fan-like shape microchambers, in accordance with embodiments of the present invention.
Figure 12I:
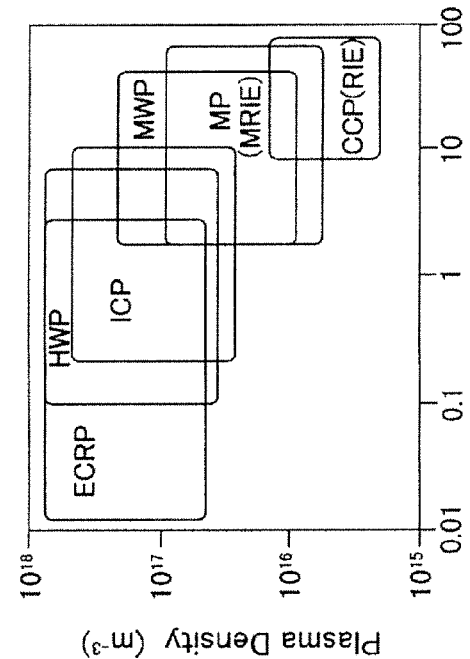
FIG. 12I is a graph of plasma densities of various types of plasma, in accordance with embodiments of the present invention.
Figure 12H:
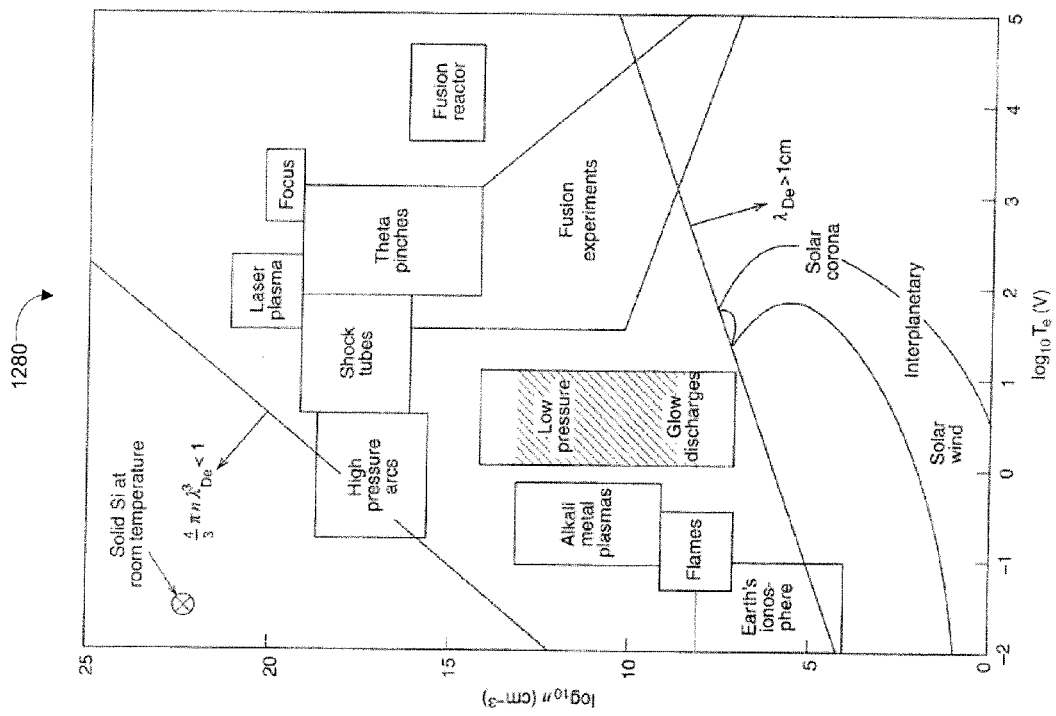
FIG. 12H is a graph of various plasma sources, in accordance with embodiments of the present invention.

FIGS. 12A-12C are plasma microchambers 1200, 1210, 1220, in accordance with embodiments of the present invention. FIG. 12D is a top view of a linear multiple microchamber system 1240, in accordance with embodiments of the present invention. FIG. 12E is a side view of a linear multiple microchamber system 1250, in accordance with embodiments of the present invention. FIG. 12F is a top view of a system 1260 including two, linear multiple microchamber systems 1262, 1262 feeding substrates to a cleaning line 1266, in accordance with embodiments of the present invention. FIG. 12G is a top view of a system 1270 with two multiple fan-like shape microchambers, in accordance with embodiments of the present invention. FIG. 12H is a graph 1280 of various plasma sources, in accordance with embodiments of the present invention. FIG. 12I is a graph 1290 of plasma densities of various types of plasma, in accordance with embodiments of the present invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma etch processing tool, comprising:
   a substrate support for supporting a substrate having a substrate surface area;
   a processing head including a plasma microchamber having an internal plasma volume bounded by a chamber insert in the processing head on all sides except for a single entire open side of the plasma microchamber, the open side of the plasma microchamber being defined by a portion of the substrate surface to be processed, the open side of the plasma microchamber being oriented over the surface to be processed, the open side of the plasma microchamber having an area that is less than the substrate surface area, and the plasma microchamber being movable relative to the substrate;
   a sealing structure defined between the substrate support and the processing head; and
   a power supply connected to the plasma microchamber and the substrate support, wherein the processing head includes a first plasma electrode and the substrate support includes a second plasma electrode, wherein the plasma microchamber is capable of generating a plasma in the internal plasma volume between the first plasma electrode and the surface to be processed, wherein only a portion of the substrate support is biased and the biased portion of the substrate support is substantially aligned with the plasma microchamber, and wherein the biased portion of the substrate support is movable for maintaining substantial alignment with the movable plasma microchamber.

2. The plasma etch processing tool of claim 1, wherein the power supply has a setting that is proportional to the internal plasma volume in the plasma microchamber.

3. The plasma etch processing tool of claim 1, wherein the power supply includes a first power supply coupled to the plasma microchamber and a second power supply coupled to the substrate support.

4. The plasma etch processing tool of claim 1, wherein the substrate support is a chuck.

5. The plasma etch processing tool of claim 4, wherein the chuck has a chucking area that is less than or equal an area of the substrate.

6. The plasma etch processing tool of claim 1, further comprising:
   a process material source coupled to the plasma microchamber; and
   a vacuum source coupled to the plasma microchamber.

7. The plasma etch processing tool of claim 6, wherein the vacuum source is an adjustable vacuum source.

8. The plasma etch processing tool of claim 1, wherein the sealing structure includes a sealing ring.

9. The plasma etch processing tool of claim 1, wherein the sealing structure defined between the substrate support and the processing head contacts the substrate support and the processing head.

10. The plasma etch processing tool of claim 1, wherein the plasma microchamber is movable relative to the surface to be processed and further comprises an actuator connected to the substrate support, the actuator configured to move the substrate support so as to expose a selected region of surface to be processed, when placed over the substrate support.

11. The plasma etch processing tool of claim 10, wherein the actuator is configured to move in one or more of a rotational direction, an angular direction, a linear direction, a non-linear direction, or a pivoting direction.

12. The plasma etch processing tool of claim 1, wherein the plasma microchamber is movable relative to the surface to be processed and further comprises an actuator connected to the plasma microchamber, the actuator configured to move the plasma microchamber so as to expose a selected region of surface to be processed, when placed over the substrate support.

13. The plasma etch processing tool of claim 12, wherein the actuator is configured to move in one or more of a rotational direction, an angular direction, a linear direction, a non-linear direction, or a pivoting direction.

14. The plasma etch processing tool of claim 1, wherein the substrate support includes an edge ring.

15. The plasma etch processing tool of claim 14, wherein at least a portion of the edge ring is biased.

16. The plasma etch processing tool of claim 14, wherein at least a portion of the edge ring is replaceable.

17. The plasma etch processing tool of claim 14, wherein at least a portion of the edge ring is reactive with a plasma in the plasma microchamber.

18. The plasma etch processing tool of claim 14, wherein the edge ring is adjacent to at least a portion of an edge of a substrate when present on the substrate support.

19. The plasma etch processing tool of claim 14, wherein the edge ring is adjacent to a curved portion of an edge of a substrate when present on the substrate support.

20. The plasma etch processing tool of claim 1, wherein the plasma microchamber includes a plurality of inlet ports and a plurality of outlet ports.

21. The plasma etch processing tool of claim 20, wherein at least one of the plurality of inlet ports is coupled to one of a plurality of process material sources.

22. The plasma etch processing tool of claim 20, wherein at least one of the plurality of inlet ports are coupled to a purge material source.

23. The plasma etch processing tool of claim 20, wherein at least one of the plurality of outlet ports are coupled to a vacuum source.

24. The plasma etch processing tool of claim 23, wherein the at least one of the plurality of outlet ports is formed in the plasma microchamber proximate to an upper portion of the plasma microchamber and capable of drawing plasma byproducts out of the plasma microchamber.

25. The plasma etch processing tool of claim 23, wherein the at least one of the plurality of outlet ports is formed in the plasma microchamber proximate to a lower portion of the plasma microchamber and capable of drawing plasma byproducts out of the plasma microchamber.

26. The plasma etch processing tool of claim 20, wherein at least one of the plurality of outlet ports are included in a top portion of the plasma microchamber.

27. The plasma etch processing tool of claim 1, further comprising at least one monitoring instrument.

28. The plasma etch processing tool of claim 27, wherein the monitoring instrument monitors a byproduct output from the plasma microchamber.

29. The plasma etch processing tool of claim 27, wherein the monitoring instrument monitors a spectrum of light emitted from the plasma microchamber.

30. The plasma etch processing tool of claim 27, wherein the monitoring instrument is coupled to a controller.

31. The plasma etch processing tool of claim 27, wherein the monitoring instrument is oriented toward the surface of the substrate.

32. The plasma etch processing tool of claim 1, wherein the internal plasma volume of the plasma microchamber has a constant width along a length of the open side of the plasma microchamber.

33. The plasma etch processing tool of claim 1, wherein the internal plasma volume of the plasma microchamber has a width that varies along a length of the open side of the plasma microchamber.

34. The plasma etch processing tool of claim 1, wherein the internal plasma volume of the plasma microchamber has a constant depth along a length of the open side of the plasma microchamber.

35. The plasma etch processing tool of claim 1, wherein the internal plasma volume of the plasma microchamber has a depth that varies along a length of the open side of the plasma microchamber.

36. The plasma etch processing tool of claim 1, wherein the internal plasma volume of the plasma microchamber has a depth that is adjustable along a length of the open side of the plasma microchamber.

37. The plasma etch processing tool of claim 1, wherein the plasma etch processing tool includes a plurality of plasma microchambers.

38. The plasma etch processing tool of claim 37, wherein the plurality of plasma microchambers have a linear arrangement.

39. The plasma etch processing tool of claim 37, wherein the plurality of plasma microchambers have a rotary arrangement.

40. The plasma etch processing tool of claim 1, wherein the internal plasma volume has a substantially centrally located cross-sectional area parallel to the surface to be processed and the area of the open side of the plasma microchamber is equal to or greater than the substantially centrally located cross-sectional area of the internal plasma volume.

41. The plasma etch processing tool of claim 1, wherein the sealing structure defined between the substrate support and the processing head does not contact the substrate surface.

42. A plasma etch processing tool, comprising:
a substrate support for supporting a substrate having a substrate surface area;
a processing head including a plasma microchamber having an open side that is oriented over the substrate support, the open side of the plasma microchamber having a process area that is less than the substrate surface area;
a sealing structure defined between the substrate support and the processing head; and
a power supply connected to the plasma microchamber and the substrate support, wherein the processing head includes a first plasma electrode and the substrate support includes a second plasma electrode, wherein the plasma microchamber is capable of generating a plasma between the first plasma electrode and the second plasma electrode, wherein only a portion of the substrate support is biased, and wherein the biased portion of the substrate support is movable.

43. The plasma etch processing tool of claim 42, wherein the plasma microchamber is movable relative to the substrate and the biased portion of the substrate support is substantially aligned with the plasma microchamber.

44. The plasma etch processing tool of claim 42, wherein the plasma microchamber has an internal plasma volume bounded by a chamber insert in the processing head on all sides except for an open side, the open side being an entire open side of the plasma microchamber, the open side of the plasma microchamber being defined by a portion of a surface to be processed, the open side of the plasma microchamber being oriented over the surface to be processed, and wherein the plasma microchamber is capable of generating a plasma in the internal plasma volume between the first plasma electrode and the surface being processed.

* * * * *